United States Patent [19]
Yotsuya et al.

[11] Patent Number: 5,093,797
[45] Date of Patent: Mar. 3, 1992

[54] APPARATUS FOR INSPECTING PACKAGED ELECTRONIC DEVICE

[75] Inventors: Teruhisa Yotsuya; Shigeki Kobayashi, both of Kyoto; Yasuaki Tanimura, Nagaokakyo, all of Japan

[73] Assignee: Omron Tateisi Electronics Co., Kyoto, Japan

[21] Appl. No.: 143,084

[22] Filed: Jan. 12, 1988

[30] Foreign Application Priority Data

| Jan. 13, 1987 | [JP] | Japan | 62-5273 |
| Jan. 13, 1987 | [JP] | Japan | 62-5274 |
| Jan. 13, 1987 | [JP] | Japan | 62-5275 |
| Jan. 13, 1987 | [JP] | Japan | 62-5276 |

[51] Int. Cl.$^5$ .............. G06F 15/20; G06K 9/36
[52] U.S. Cl. .................. 364/489; 364/552; 358/101; 358/106; 356/392; 356/394; 382/8
[58] Field of Search .......... 364/552, 507, 469, 468, 364/488, 489, 490; 358/101, 106; 356/392, 393, 394; 382/8

[56] References Cited

U.S. PATENT DOCUMENTS

| 3,872,243 | 3/1975 | Soames et al. | 358/107 |
| 4,345,312 | 8/1982 | Yasuye et al. | 358/106 |
| 4,379,308 | 4/1983 | Kosmowski et al. | 358/107 |
| 4,450,579 | 5/1984 | Nakashima et al. | 382/8 |
| 4,473,842 | 9/1984 | Suzuki et al. | 358/106 |
| 4,589,139 | 5/1986 | Hada et al. | 358/107 |
| 4,642,813 | 2/1987 | Wilder | 358/101 |
| 4,644,584 | 2/1987 | Nagashima et al. | 382/34 |
| 4,707,734 | 11/1987 | Labinger et al. | 358/101 |
| 4,718,089 | 1/1988 | Hayashi et al. | 358/22 |
| 4,758,782 | 7/1988 | Kobayashi | 358/106 |
| 4,776,023 | 10/1988 | Hamada et al. | 382/8 |

OTHER PUBLICATIONS

"An Automatic Optical Printed Circuit Inspection System" by Restnick, III, SPIE vol. 116, Solid State Imaging Devices, 1977, pp. 76–81.

"An Automatic Inspection System for Printed Wiring Board Masks" by Goto and Kondo, Pattern Recognition, vol. 12, pp. 443–455, 1980.

"Automated Optical Inspection of Multilayer Printed Circuit Boards" by Bentley, SPIE vol. 220, Optics in Metrology and Quality Assurance, pp. 102–109, 1980.

Thissen, "An equipment for automatic optical inspection of connecting-lead patterns for integrated circuits", pp. 77–88, Philips Technical Review, vol. 37, 1977.

Primary Examiner—Gary Chin
Assistant Examiner—V. Trans
Attorney, Agent, or Firm—Fish & Richardson

[57] ABSTRACT

A printed circuit board inspecting apparatus, in which image data of a packaged circuit board under inspection obtained by picking up the image of the circuit board are processed through predetermined processing procedure for examining packaged states of parts mounted on the packaged cicuit board. The apparatus comprises an imaging unit for picking up the image of a packaged circuit board, a decision unit for deciding the state of the parts mounted on the packaged circuit board, and a visualizing unit for displaying visibly the result of the decision and position of the relevant part in correspondence with each other. The apparatus can further include a land extracting unit for extracting lands from the image obtained through the imaging of the packaged circuit board under inspection, an alarm condition setting unit for setting the condition for generating an alarm, and an alarm generating unit for generating the alarm when the alarm condition is met by the result of decision made by the decision unit.

18 Claims, 21 Drawing Sheets

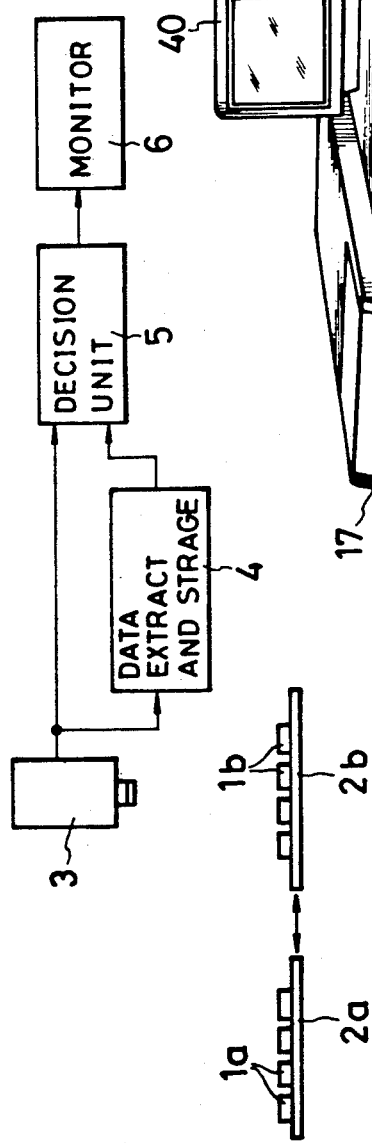
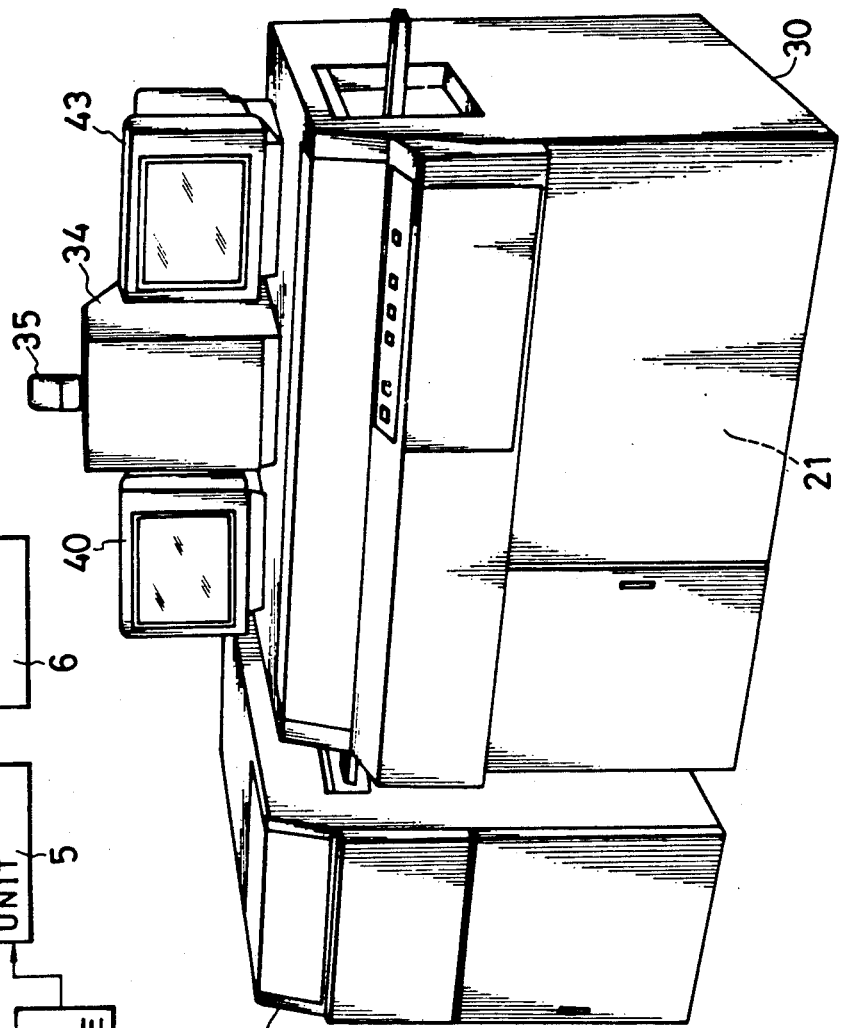

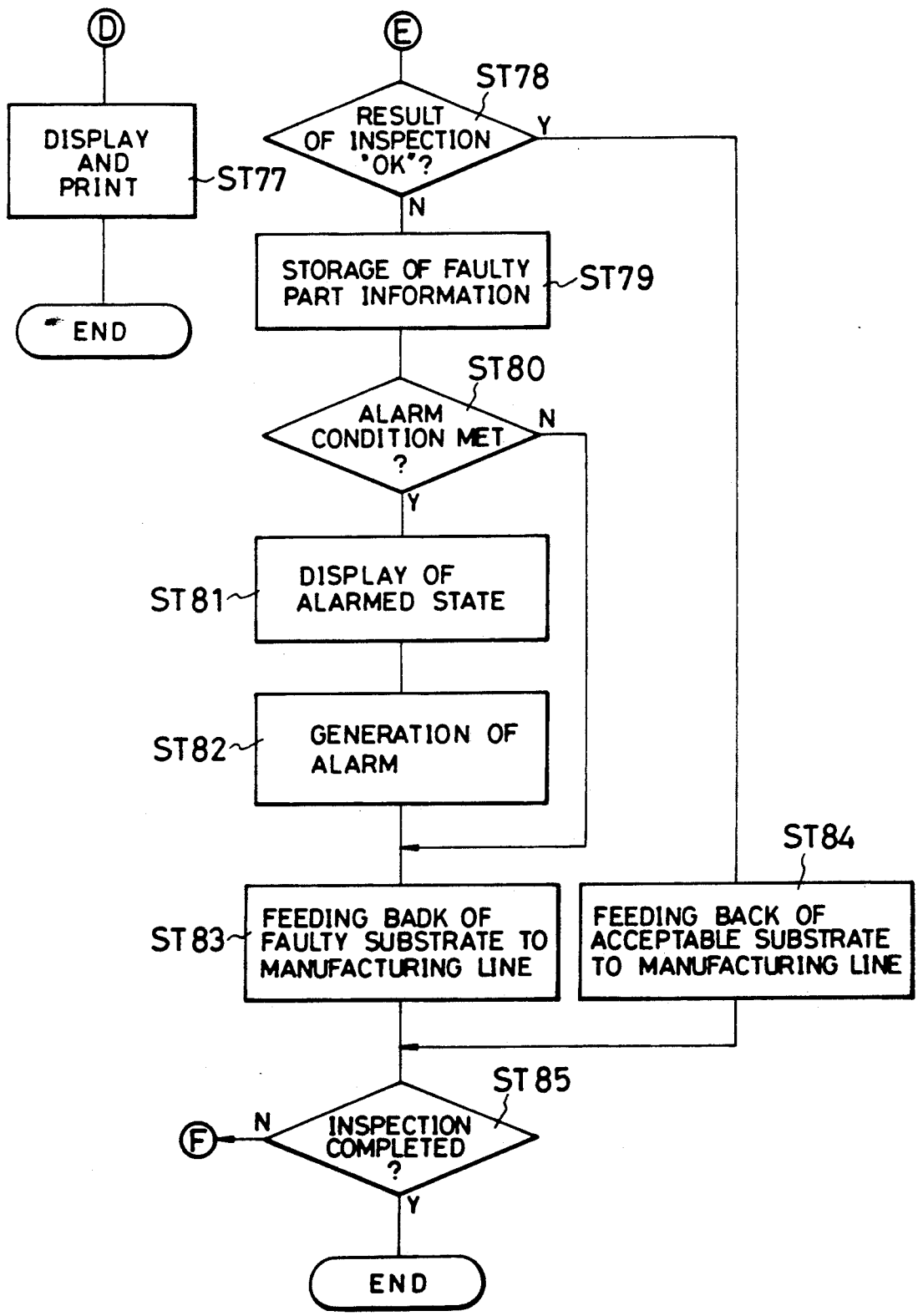

```
TABLE OF FAULTY PARTS
C19
R12
Q03
D22
```

| CASSETTE No. | COLUMN No. | NUMBER OF FAULTY PARTS | IDs OF FAULTY PARTS |
|---|---|---|---|
| 2 | 1 | 3 | 20 . 50 . 60 |

5,093,797

APPARATUS FOR INSPECTING PACKAGED ELECTRONIC DEVICE

BACKGROUND OF THE INVENTION

1. Field of the Invention

The present invention relates generally to an apparatus for inspecting packaged electronic devices. More particularly, the invention is concerned with an apparatus for inspecting a printed circuit board (hereinafter referred to as a substrate) mounted or packaged with electric and/or electronic parts (hereinafter referred to as the packaged substrate or device), which apparatus is capable of automatically identifying discriminatively the types or species of electronic parts mounted on a substrate and examining the packaged device as to whether the parts thereof are mounted at respective correct positions on the substrate.

2. Description of the Prior Art

As the packaged device inspecting apparatus (also known as the package inspecting system) for inspecting the packaged electronic/electric device equipped with electric and/or electronic parts by using a mounter or the like means, there has heretofore been known such a structure as schematically shown in FIG. 1 of the accompanying drawings.

As will be seen in this figure, the packaged device inspecting apparatus or system is composed of a television camera (referred to simply as TV camera) 3 for picking up an image (also referred to as imaging) of a substrate 2b on which electronic/electric parts 1b are mounted or packaged and which is to be inspected and a reference packaged substrate 2a having parts 1a which serves as a reference or standard substrate for the inspection, a feature data extraction/storage unit 4 for extracting and storing the feature data of shapes, positions, colors of the parts 1a from the image (reference image) of the reference packaged substrate 2a picked up by the TV camera 3, circuit 5 for comparing the data of image (image to be examined) of the packaged substrate 2b under inspection available from the TV camera 3 with the reference image data stored in the feature data extraction storage unit 4 for making decision as to whether all requisite parts 1b are mounted on the packaged substrate 2b under test or whether any of the mounted parts 1b are displaced or dislocated from the respective correct positions, and a monitor unit 6 for displaying or printing out the results of the decision made by the comparison/decision unit 5.

In the packaged substrate inspecting apparatus known heretofore, the data resulting from the examination or inspection of the packaged substrate 2b under test are displayed or printed out by the monitor to thereby inform the inspector in charge of any package failure for the repair. In this connection, it is however noted that since the package failure information is displayed or printed out in terms of part identification numbers (serial numbers and/or part classification numbers, not only difficulty is encountered but also a lot of time is required for inspecting and repairing the faulty parts or portions by referring to the outputted part identification number in case several hundreds of parts are mounted on the substrate of concern, not speak of a lot of time and troublesome procedure.

On the other hand, it is difficult to store the positions of the parts mounted on the substrate in combination with the respective assigned identification numbers. In reality, a lengthy troublesome procedure will be required for satisfactory of erroneous memorization, lapse of memory and degradation in reliability.

Further, in the case of the hitherto known packaged device inspecting apparatus, the standard image and that of a packaged substrate under test obtained through the TV camera 3, being followed by extraction of the data concerning the positions and the shapes of the parts 1a and 1b, wherein inspection is made as to whether the part 1b is correctly mounted by comparing the positions and shapes with those of the reference part 1a. Accordingly, in case parts incorporated in the reference packaged device and the device under test are of a same color as that of the blank substrate material of the packaged devices, the threshold level for digitizing the reference image signal and that of the device under test can not be definitely determined, making it impossible to extract the feature data of the parts 1a and 1b.

Besides, in the case of the conventional packaged device inspecting system, the package to be examined is inspected one by one for deciding if the device of concern is satisfactory, wherein the result of the decision is displayed to give information to the operator on the one-by-one basis whether the device now examined is good or not. Consequently, even when only a specific part becomes faulty due to failure in a corresponding mounter upon manufacturing of the individual packaged substrate 2b under test, it is impossible to detect the failure of the specific part at an earlier stage for eliminating the cause for the failure, giving rise to a problem.

The prior art packaged substrate inspecting apparatus of the type outlined above is so designed as to compare directly the image of the part 1a mounted on the standard or reference packaged substrate 2a with that of the part 1b mounted on the printed substrate 2b under inspection for detecting the absence or positional deviation of the part 1b. Accordingly, even when the positions and sizes of land patterns formed on the substrate are not matched with the sizes and shapes of the parts 1a and 1b due to error in design, resulting in that the part 1b and the corresponding land pattern are not in the predetermined positional relationship, there arises a possibility that the decision is made to the effect that the part 1b is mounted satisfactorily.

SUMMARY OF THE INVENTION

In the light of the state of the art reviewed above, it is a first object of the present invention to provide a packaged substrate inspecting apparatus which is capable of informing operator of the position of any faulty part without need for storage of part identification numbers is association with the positions at which the corresponding parts are mounted.

It is a second object of the present invention to provide a packaged substrate inspecting apparatus which is capable of extracting feature data even for those parts mounted on blank substrates for the reference package and a package under test which present a same color as that of the blank substrate.

A third object of the present invention is to provide a packaged substrate inspecting apparatus in which when only a specific part undergoes failure in the mounting, a corresponding alarm can be produced to inform of operator of the above fact so that he or she can have the chance to eliminate the cause for the faulty mounting.

A fourth object of the present invention is to provide a packaged substrate inspecting apparatus which is capable of detecting the absence and positional dislocation of any parts and additionally determining whether sizes and shapes of the parts mounted on a substrate are matched with positions and sizes of corresponding land patterns.

In view of the above objects, there is provided according to an aspect of the present invention a packaged substrate inspecting apparatus for inspecting the mounted state of parts on a packaged substrate by picking up the image thereof and processing the image data through predetermined procedure, which apparatus comprises imaging means for picking up the image of a substrate and decision means for deciding whether a land pattern formed on the substrate is proper or not on the basis of the result of processing the image obtained through the imaging means.

With the arrangements of the packaged substrate inspecting apparatus, operator can recognize straightforwardly the positions of faulty parts. Besides, feature data can be derived even for those parts having same color as a blank substrate of the packaged device.

Further, in case failure occurs only in specific parts mounted on packaged substrates, an alarm can be produced to inform operator of this fact for thereby allowing the cause for the failed mounting to be eliminated at an earlier stage.

Besides, in addition to the detection of the absence of a part as well as positional deviation thereof, detection can be made as to whether sizes and shapes of parts to be mounted on a substrate are matched with positions and sizes of land patterns corresponding to the parts, respectively.

BRIEF DESCRIPTION OF THE DRAWINGS

The above and other objects, novel features and advantages of the present invention will be more apparent upon consideration of the following description of the exemplary and preferred embodiments thereof taken in conjunction with the accompanying drawings, in which:

FIG. 1 is a view showing schematically in a block diagram an exemplary embodiment of a hitherto known packaged substrate inspecting apparatus;

FIG. 2 is a perspective view showing a packaged electronic device or packaged substrate inspecting apparatus according to an exemplary embodiment of the invention;

FIG. 12 is a view illustrating in a flow chart an example of the processing executed at the final step of the inspection routine shown in FIG. 11;

FIG. 13 is a view illustrating in a flow chart another example of the processing executed at the final step of the inspection routine shown in FIG. 11;

DESCRIPTION OF THE PREFERRED EMBODIMENTS

Figure 3:
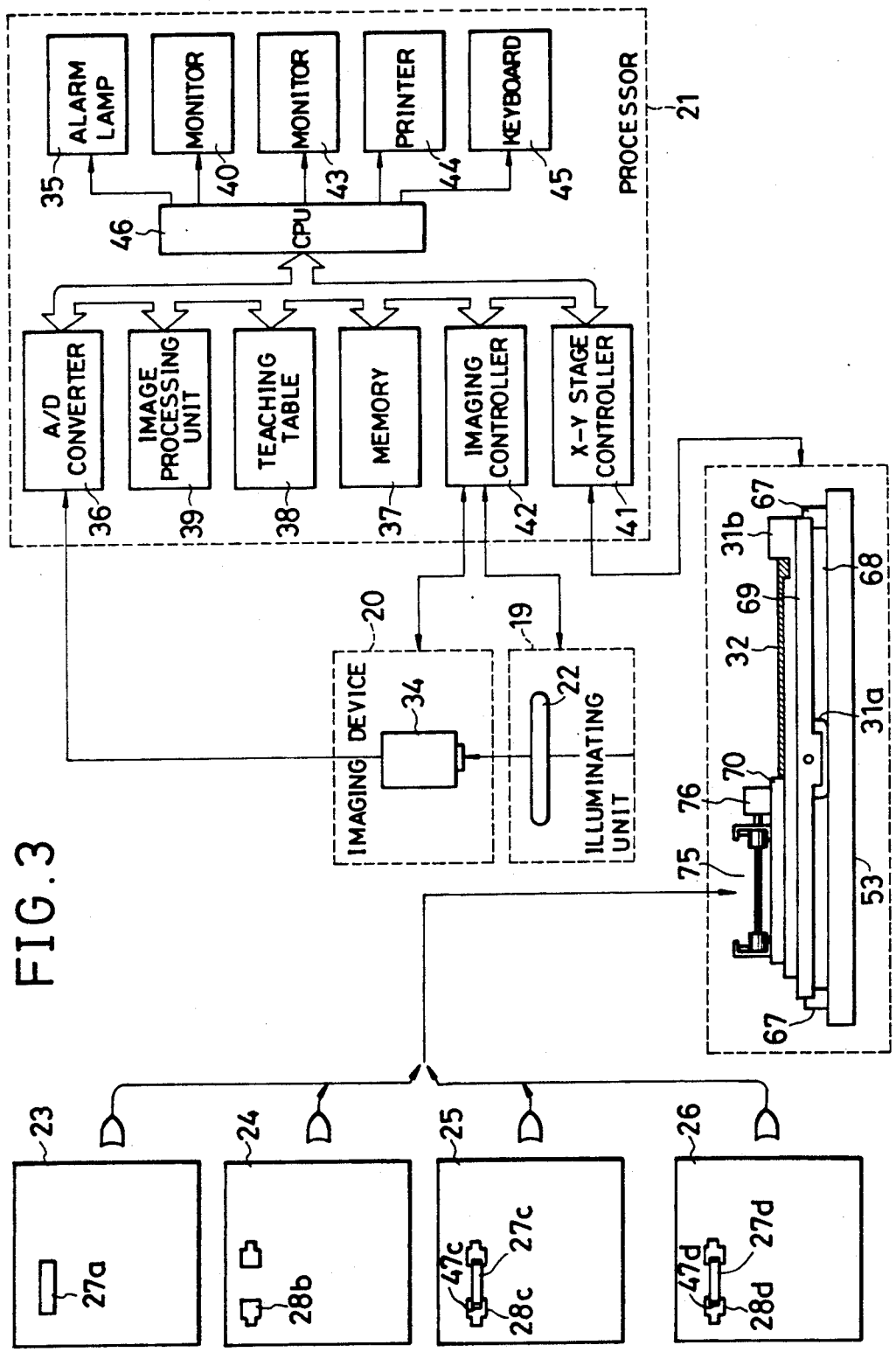
FIG. 3 is a view showing in a block diagram a general arrangement of the packaged electronic device (or packaged substrate) inspecting apparatus shown in FIG. 2.

Now, the present invention will be described in detail in conjunction with the preferred embodiments illustrated in the drawings.

FIG. 2 shows in a perspective view an outer appearance of a packaged substrate inspecting apparatus according to an exemplary embodiment of the invention, and FIG. 3 shows in a block diagram a general arrangement thereof.

Referring to these figures, the packaged substrate inspecting apparatus includes a X-Y table or stage unit 18, a sorter 17, an illuminating unit 19, an image pick-up device 20, and a processing unit generally denoted by a numeral 21, wherein a teaching substrate 23(i.e. a substrate having a portion 27a painted in white with the other portion in black), a reference packaged substrate 24 and a non-packaged substrate 25 are imaged, the resulting image data being used for preparing as inspection file, which is referred to in making decision as to whether parts 27d are correctly mounted on a packaged substrate 26 to be inspected, on the basis of the image data obtained from the latter.

Unless packaged substrate 26 under test has a part 27d mounted correctly, information of this mount failure is memorized. When the number of such faulty mount information has met the preset alarm condition, an alarm is generated to inform the operator of this fact.

The illuminating unit 19 includes a ring-like white light source 22 which is turned on and off (or intensity-controlled) by a control signal supplied from the aforementioned processing unit 21. More specifically, when an illumination activating signal is supplied from the processing unit 21, the lamp is lit to illuminate continuously the top surface of the X-Y table 18 until an illumination deactivating signal is supplied from the processing unit 21.

Figure 4:
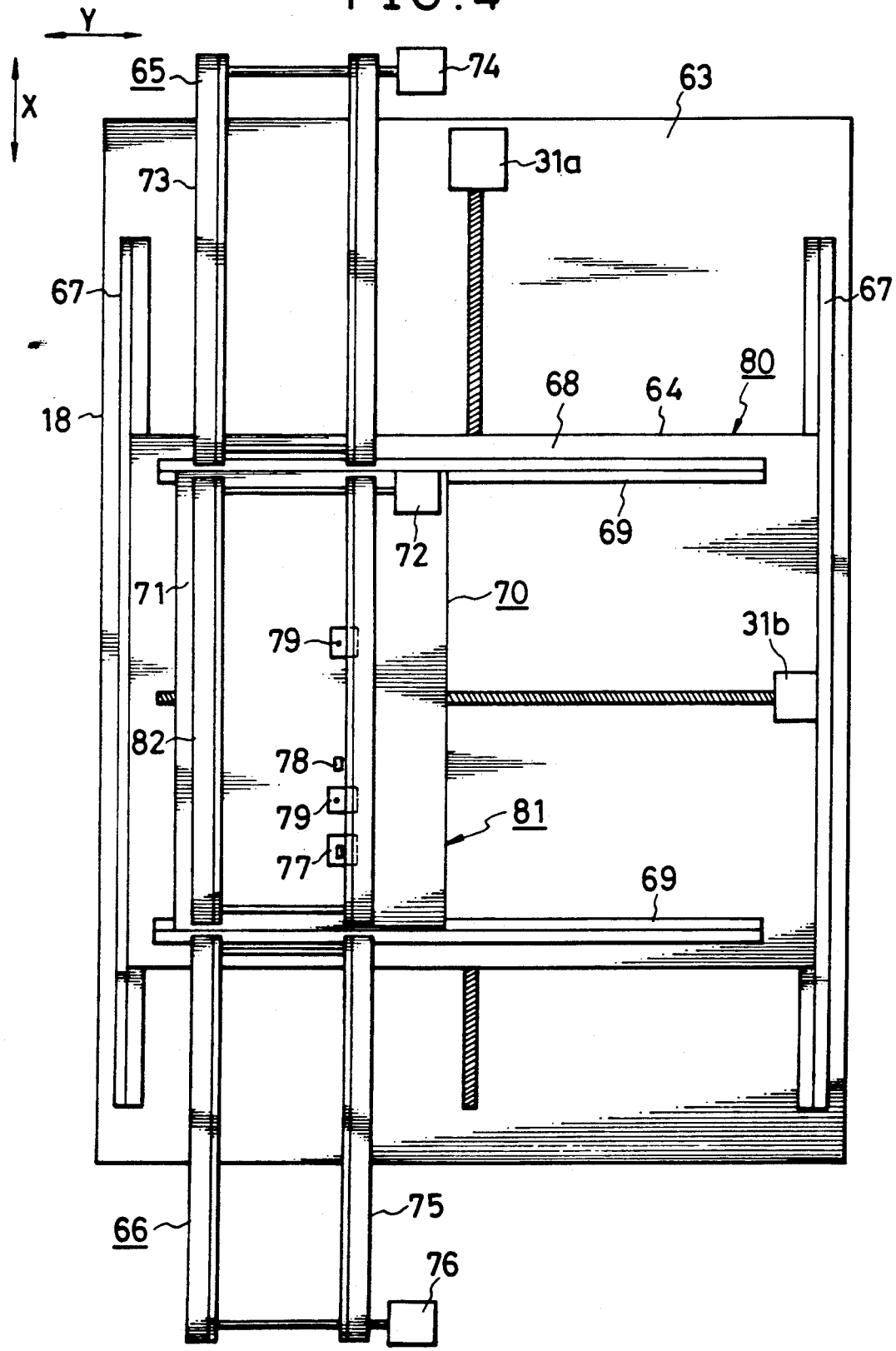
FIG. 4 is a top plan view showing an X-Y table structure incorporated in the inspecting apparatus.

The X-Y table (stage) assembly 18 includes a base 63, an X-Y table mechanism 64 disposed on the base 63, a loader 65 disposed on the X-Y table mechanism 64 at one end thereof and an unloader 66 provided on the X-Y table mechanism 64 at the other end thereof, as is shown in FIG. 4, wherein the loader 65 and the unloader 66 cooperate to constitute a transporting mechanism. Upon insertion of the individual substrate 23, 24, 25 or 26 in the loader through an inlet port, the transporting mechanism moves stepwise these substrate 23, 24, 25 or 26, in the course of which they are imaged by the image pick-up device 20 a requisite number of times to be subsequently fed to a succeeding processing stage (not shown).

Figure 5:
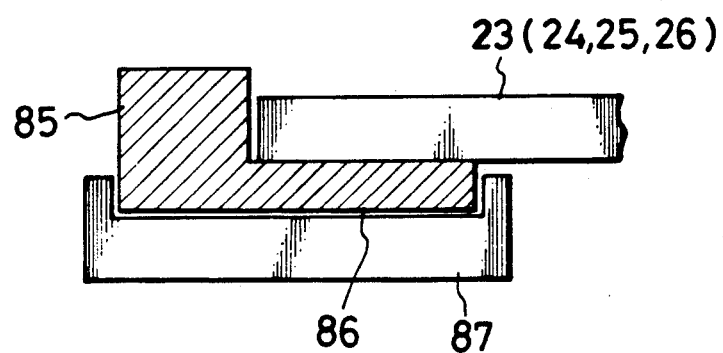
FIG. 5 is a sectional view for illustrating a transportation belt mechanism adopted in the X-Y table structure shown in FIG. 4.
Figure 6:
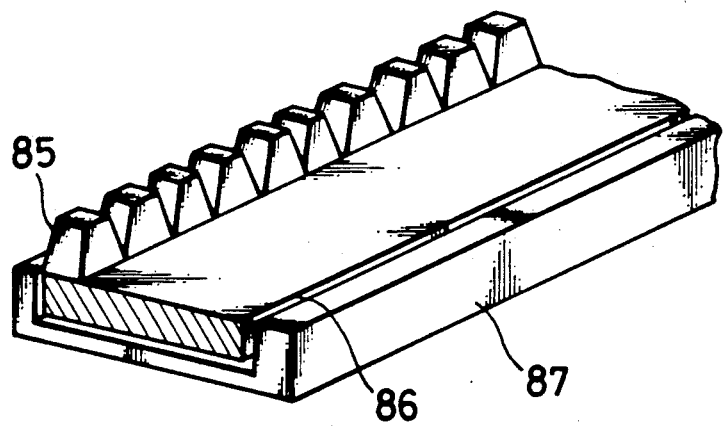
FIG. 6 is a perspective view showing the transportation belt mechanism.

Referring to FIGS. 5 and 6, the loader 65 is composed as a conveyor belt mechanism 73 which includes an endless belt made of, for example, polyurethane and having a guide portion 85 formed with a series of notches and a guide plate 87 for guiding the endless belt 86 and a reversible motor 74 for driving the conveyor belt mechanism 73 in response to a control signal supplied from the aforementioned processor unit 21. With such structure, the loader 65 serves to feed the individual substrate 23, 24, 25 or 26 as inserted through the inlet port to the X-Y table mechanism 64 and store temporally the substrate 23, 24, 25 or 26 fed back from the X-Y table mechanism 64.

The X-Y table mechanism 64 includes a X-positioning unit 80 disposed on the base 63, a Y-positioning unit 81 disposed on the X-positioning unit 80 and a transporting unit 82 disposed on the Y-positioning unit 81.

The X-positioning unit 80 includes a pair of guide rails 67 movably in the X-direction, and an X-pulse motor 31a for driving the X-table 63 in response to the control signal supplied from the aforementioned processor unit 21.

On the other hand, the Y-positioning unit 81 includes a pair of guide rails 69 mounted on the X-table 68, a Y-table supported by the guide rails 69 movably in the Y-direction and a Y-pulse motor 31b for driving the Y-table 70 in response to a control signal supplied from the processing unit 21.

The transporting mechanism 82 includes a conveyor belt mechanism 71 of the structure similar to the aforementioned conveyor belt mechanism 73 of the loader 65, a reversible motor 72 for driving the conveyor belt mechanism 71 in response to a control signal supplied from the processing unit 21, a retractable stopper mechanism 77 for stopping each of the individual substrates 23, 24, 25 and 26 transported by the conveyor belt mechanism 71 at a predetermined position, a sensor 78 for detecting the fetching of the substrate by the conveyor belt mechanism 71, and a retractable positioning pin mechanism for holding stationarily the substrate 23, 24, 25 or 26 fed by the conveyor belt mechanism 71.

In operation, when the substrate 23, 24, 25 and 26 is supplied from the loader 65 and the unloader 66, it is received by the conveyor belt mechanism 71, whereupon the substrate 23, 24, 25 and 26 is displaced to a position below the imaging unit 20 by the aforementioned pulse motors 31a and 31b, being followed by the image pick-up operation by the imaging unit. Upon completion of the imaging operation, the conveyor belt mechanism 71 is returned to the original or starting position for moving the substrate 23, 24, 25 or 26 to the loader 65 and the unloader 66.

The unloader 66 is composed of a conveyor belt mechanism 75 of the structure similar to that of the aforementioned conveyor belt mechanism 73 of the loader 65, and a reversible motor 76 for driving the conveyor belt mechanism 75 under the command of a control signal issued by the processing unit 21, for serving to store temporarily the individual substrates 23, 24, 25 and 26 fed from the X-Y table mechanism 64 and subsequently return the substrates to the X-Y table mechanism 64 or discharge them through an outlet port.

In case substrates disposed on the X-Y table 32 are the non-packaged substrate 25 or the reference packaged substrate 24, they are imaged alternately a plurality of times. Thereafter the substrates are fed to the sorter 17 by means of the discharging conveyor mechanism mentioned above.

On the other hand, when substrates disposed on the X-Y table 32 are the teaching substrate 23 and the packaged substrate 26 to be inspected, they are imaged only once, respectively, and fed to the sorter 17.

The sorter 17 includes a casing of a rectangular configuration, as shown in FIG. 2, and serves for classifying the individual substrates 23, 24, 25 and 26 supplied from the X-Y table unit 18 under the command of a control signal supplied from the processing unit 21.

The image pick-up device or imaging device 20 is equipped with a color TV (television) camera 34 disposed above the illumination unit 19, whereby the optical images of the substrates 23, 24, 25 and 26 are converted into electric image signals (i.e. video signals) containing color or chrominance components R (red), G (green) and B (blue), the video signals thus produced being supplied to the processing unit 21.

The processing unit 21 includes an analogue-to-digital (A/D) converter 36, a memory 37, a memory 38, an image processor 39, two monitors 40 and 41, an imaging controller 42, a printer 44, a keyboard 45, an alarm lamp 35 and a central processing unit (hereinafter referred to as CPU) 46. In the teaching mode, the color or chrominance signal components R, G and B supplied from the image pick-up device 20 and reflecting the colors of the substrates 23, 24 and 25 are processed to create an inspection data file to be referenced upon inspection of a packaged substrate 26 under test. At the time of inspection or examination of the packaged substrate 26, the chrominance component signals R, G and B supplied from the image pick-up device 20 for picking up the image of the packaged substrate 26 under inspection are processed by reference to the aforementioned inspection file, wherein the result of the processing is utilized in deciding whether the relative position between parts 27d and lands 28d formed on the packaged substrate under test lies within a permissible range or not. The result of the decision is displayed, printed out and/or filed.

Every time the part 27d is found not to be correctly mounted on the packaged substrate 26 under inspection, information of the faulty mounted state is stored. When the result of accumulation of the faulty mount information meets the preset alarm condition, an alarm is produced to inform the operator of this fact.

In this connection, the following alarm conditions or criteria may be set previously.

(1) A number "A" of successive packaged substrates 26 undergone inspection have same parts found as being mounted faultily.

(2) Of a number "B" of successive packaged substrates undergone inspection, same parts are found to be mounted faultily for more than "C" substrate.

(3) Frequency of occurrence of the faulty mount states of parts in the single packaged substrate undergone inspection is greater than "D" %.

When any one of the above conditions is met, the alarm is generated. The values of the variables "A" to "D" mentioned above may be loaded through the keyboard 45.

The A/D converter 36 is supplied with image or video signal (chrominance signal components R, G and B) from the aforementioned imaging device 20 for creating color image data through analogue-to-digital conversion, the resultant image data being then supplied to the control unit or CPU 46 and the monitor 40.

The memory unit 37 may be constituted by a random access memory or RAM, a hard disc or like which serves as the work area for the control unit or CPU 46.

The image processor 39 is supplied with the color image data by way of the CPU 46 for digitizing the data in the form of binary signal and is so arranged as to extract the position and shape (profile) data of electric/electronic parts, cut out relevant image portions from the color image data, perform chrominance-to-brightness (luminosity) conversion for the cut-out image portion, transform the result of the chrominance/brightness conversion into a binary signal with reference to a preset threshold value for extracting the data of position, geometrical configuration (shape) or other factors of the land pattern. All the data generated by the image processor 39 are supplied to the CPU 46.

The table storage 38 includes a floppy disc device or the like for storing therein data file for inspection or other purposes supplied from the CPU 46. When a transfer request is issued from the CPU 46, the inspection data file is read out to be transferred to the CPU 46.

The imaging controller 42 is provided with an interface for connection to the CPU 46, the illuminating unit 19 and the image pick-up device 20 for controlling the illuminating unit 19 and the image pick-up device 20 in accordance with the command signals issued by the CPU 46.

The X-Y stage controller 41 includes an interface for connection to the CPU 46 as well as to the X-Y table assembly 18 for controlling the latter in accordance with the command signal outputted from the CPU 46.

On the other hand, the monitor 40 includes a cathode ray tube (CRT) for display on the screen thereof the color image data of the substrates 23, 24, 25 and 26 supplied from the A/D converter 36. At the same time, the monitor 40 responds to reception of part profile frame data (image processing frame data), point command and others supplied from the CPU 46 to display in superposition a corresponding part profile frame 57, as shown in FIG. 14(B), and a region (a land 28b in the case of the illustrative embodiment) in color designated by the point command, as shown in FIG. 14(C).

Figure 15A:
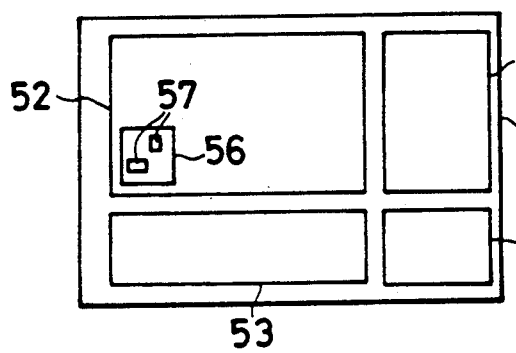
FIG. 15(A) to 15(F) are views showing schematically examples of displays produced by the other monitor in the course of operations shown in FIGS. 7 to 13.

On the other hand, the monitor 43 which may be constituted by a CRT has a screen divided into a graphic display area 52 for displaying in graphics the processed state of a substrate as a whole, an operation procedure indicating area 53 for displaying messages of operating procedure to the operator, a dimension display area 54 for displaying various data of the substrate, and an error message area 55 for displaying a variety of error messages, as is illustrated in FIG. 15(A). The graphic image data, operation procedure data, dimension data, results of decisions, error data and others to be displayed on the monitor 43 are supplied from the control unit or CPU 46 to be displayed in the associated areas.

The printer 44 is adapted to print out the results of decision supplied from the CPU 46 in a predetermined format.

The keyboard 45 includes a variety of keys required for inputting the data or information required for operation of the system, alarm data, the names and sizes of packaged electronic/electric devices or substrates 26 to be inspected as well as data concerning the parts 27c mounted on the substrate 26. The data and information entered through the keyboard 45 are supplied to the CPU 46.

The alarm lamp 35 is disposed at the top of the color TV camera 34 of the housing 30 for the packaged substrate inspecting apparatus 30, as shown in FIG. 2, and is lit in response to the alarm signal supplied from the CPU 46, informing the operator of the alarm condition having been validated.

The CPU or central processing unit 46 is constituted by a microprocessor and other associated circuits and adapted to perform operations described below.

Figure 7:
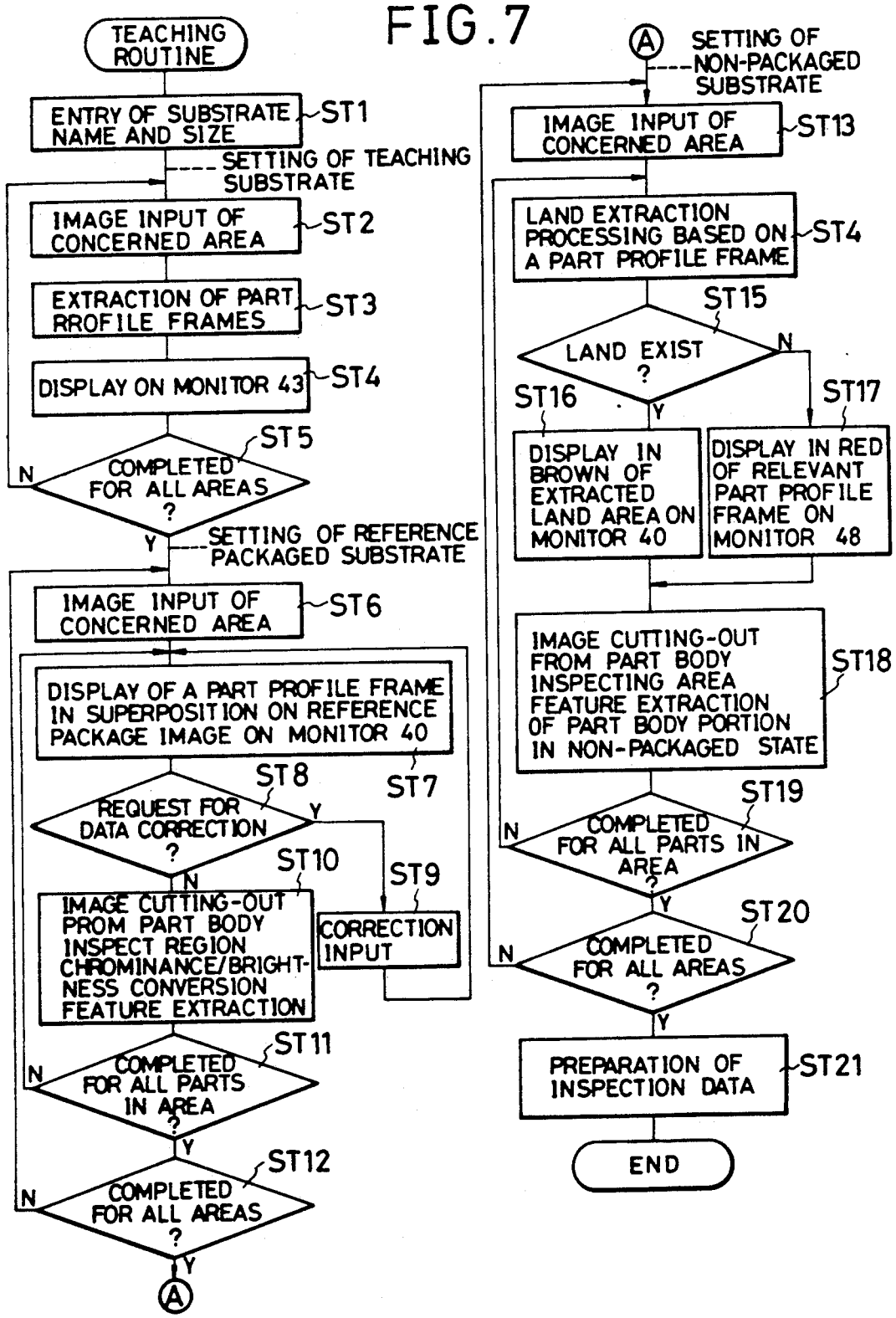
FIG. 7 is a view illustrating in a flow chart a teaching routine for teaching a procedure for determining mounted states of parts on a substrate in the packaged substrate inspecting apparatus.

When a new packaged substrate 26 is to be inspected, the CPU 46 commands the monitor 43 to display in the operation procedure indicating area 53 a message requesting for the entry of data concerning the indentification name (e.g. identification number) of the substrate to be inspected and the size thereof, as illustrated in a teaching flow chart of FIG. 7 at a step ST1.

When the substrate identification and size data as prompted on the monitor 43 and additionally the variables "A", "B", "C" and/or "D" for the alarm criteria are entered through the keyboard 45, the CPU 46 stores these data in the memory 37 and waits for disposition of a template or teaching substrate 23 designed for use in executing the teaching procedure on the conveyor belt mechanism 31 by rotating forwardly the X-Y table 18. When the template or teaching substrate is loaded in place, the CPU 46 controls the X-Y table 18 so that a first area to be processed of the teaching substrate 23 is positioned underneath the color TV camera 34 at a step ST2, while causing the monitor 43 to display a processing frame 56 indicating the position, shape and other parameter of the area being currently processed (the first area to be processed in this case) in the graphic area 52, as shown in FIG. 15(A).

Subsequently, the first area to be processed of the teaching substrate 23 is imaged by the color TV camera 34 under the command of the CPU 46. The color video signals (R, G, B) thus produced by the TV camera 34 are then subjected to A/D conversion through A/D converter, the result of the A/D conversion (i.e. color image data of the teaching substrate 23) being stored in the memory 37 on the real time basis.

Figure 14A:
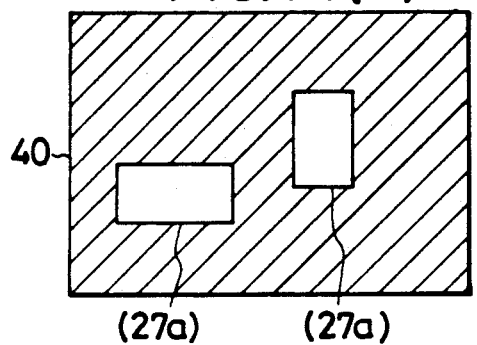
FIG. 14(A) to 14(E) are views showing schematically examples of displays produced in one monitor in the course of operations shown in FIG. 7 to 13.

At the same time, the color image data of the teaching substrate 23 outputted from the A/D converter 36 are also supplied to the monitor 40 to be displayed thereon, as illustrated in FIG. 14(A).

Subsequently, the CPU 46 reads out successively the data of R-pixels (or alternatively, G- or B-pixels) from the memory 37 at a step ST3. The image data as read out are then converted into binary signals through the image processor 39, from which the data concerning the white regions on the teaching substrate 23 (corresponding to the part portion 27a) is extracted. Subsequently, position data as well as shape (profile) data of the parts 27a obtained through the extracting operation are loaded in the memory 37.

At a step ST4, part profile frames 57 indicating the positions and the shapes of the parts 27a are displayed on the monitor 43 in the graphic display area 52, as shown in FIG. 15(A), on the basis of the position data and the shape data of the parts 27a stored in the memory 37 under the control of the CPU 46.

Upon completion of preparation of the part profile frames 57 as well as displaying thereof for all the parts 27a located within the first area subjected to the processing, the CPU 46 resumes the step ST2 through a step ST5, whereby the abovementioned processing is repeatedly executed for the parts located in other areas on the substrate.

In this connection, it should be mentioned that the individual areas subjected to the processing are so selected to overlap each other only slightly. Consequently, a part 27a which is not covered by the area being processed at a given time is covered by some one of the succeeding areas to be processed subsequently.

Figure 15D:
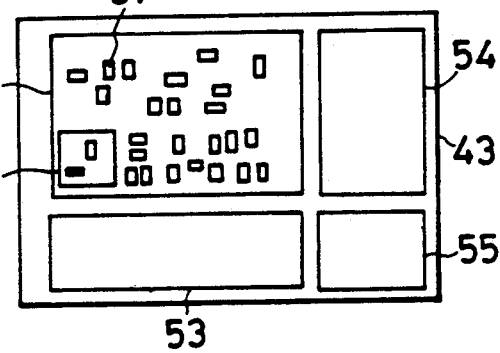
Figure 15B:
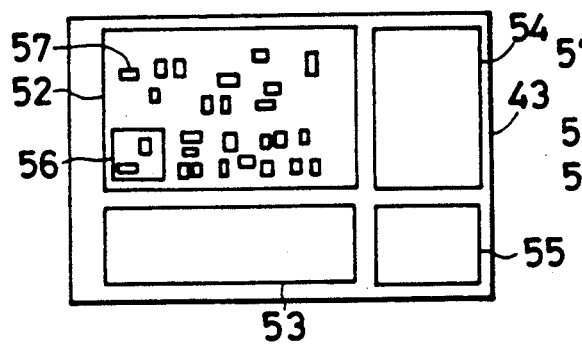
Figure 15E:
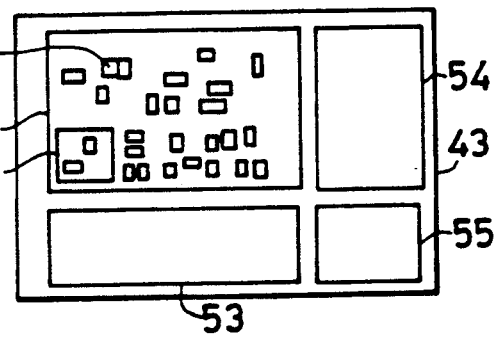

When the part profile frames 57 have been obtained for all the parts 27a, as illustrated in FIG. 15(B), the CPU 46 leaves the current processing routine and rotates forwardly the X-Y table 18 to allow the teaching substrate 23 to be removed and waits for the disposition of the reference packaged substrate 24.

When the reference packaged substrate 24 is placed on the conveyor belt 71 in the X-Y table 18 at a step ST6 to thereby position the first area to be processed of the reference packaged substrate below the color TV camera 34, while causing the monitor 43 to display a processing frame 56 indicative of the area to be processed at that time (i.e. the first area to be processed) and the part profile frames 57 in the graphic area 52, as illustrated in FIG. 15(B).

Subsequently, the first area subjected to the processing of the reference packaged substrate 24 is imaged by the color TV camera 34 under the control of the CPU 46. The color image signals R, G, B thus produced by the TV camera 34 undergo A/D conversion. The resulting data (color image data of the reference packaged substrate 24) are then stored in the memory 37 on the real time basis.

At the same time, the color image data resulting from the A/D conversion (36) are also supplied to the monitor 40 to be displayed thereon.

Figure 14D:
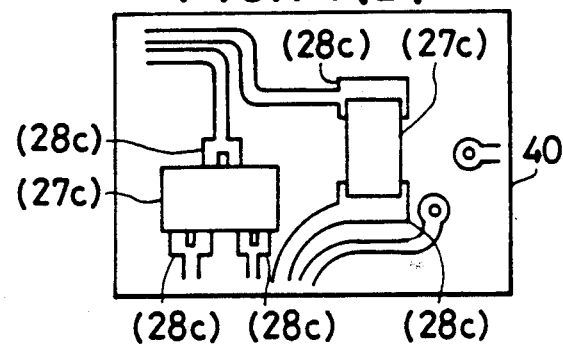
Figure 14B:
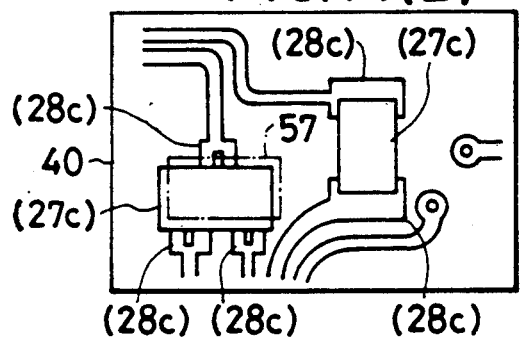
Figure 15C:
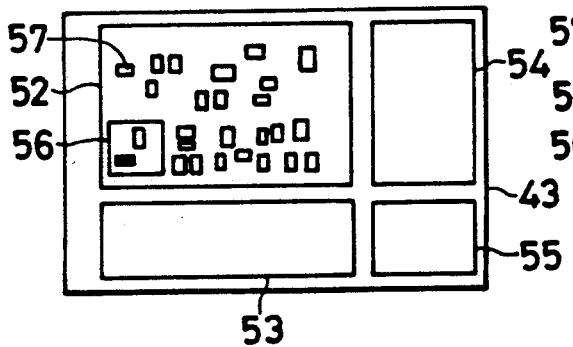
Figure 15F:
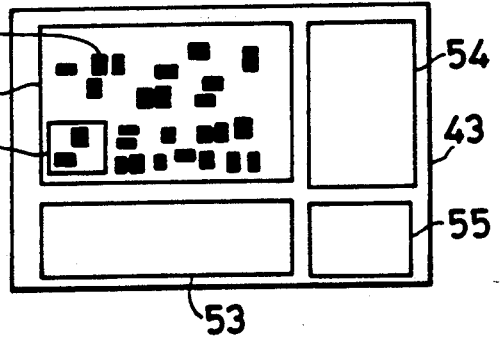

Next, at a step ST7, the CPU 46 reads out from the memory 37 the first part profile frame data for the part 27c located within the area being processed, which data is then supplied to the monitor 40, whereby a part profile frame 57 is displayed in superposition, as shown in FIG. 14(B). Further, the part profile frame data is also supplied to the monitor 43, whereby a part profile frame 57 corresponding to the part contour frame data is displayed in green, as shown in FIG. 15(c).

Now, at a step ST8, the CPU 46 produces on the monitor 43 in the operation procedure indicating area 53 messages asking whether the part 27c corresponding to the part profile frame 57 displayed in green is a part other than resistor (e.g. transistor, capacitor, diode or a flap package IC), if the orientation of the electrodes is correct and if alteration of the part profile frame 57 in respect to the position and shape is required.

In case the part 27c is other than the resistor or when the profile or contour of the part 27c displayed on the monitor 40 is not overlapping the part profile frame displayed graphically with a permissible tolerance or when the operator observing the screen decides that the type of the part 27c, orientation of the electrodes thereof and the position and shape of the part profile frame 57 relevant to the part 27c should be altered to thereby an alteration request key on the keyboard 45, the CPU 46 jumps to a step ST9 from the step ST8.

It is assumed that, at a step ST9, the operator alters the type of the part and the orientation of the electrodes with the aid of a type changing key and an orientation altering key in combination with an enlarging key, a contracting key, a parallel moving key and other, as occasion requires, so that the position and shape of the graphically displayed part profile frame 57 are changed to overlap the profile image of the part 27c displayed on the monitor 40. Then, the CPU 46 modifies correspondingly the type or species data, orientation data, position data and the shape data for this part 27c stored in the memory 37 and thereafter regains the step ST7 to execute again the processing described hereinbefore for the part 27c.

On the other hand, when the part 27c is a resistor with electrodes thereof being oriented correctly and when the profile or contour of the part 27c displayed on the monitor 42 overlaps the graphically displayed part profile frame 57 with a permissible tolerance, the operator will make decision that there is no need for alteration of the type or species and the electrode orientation of the part 27c as well as the position and shape of the part profile frame 57 corresponding to the part 27c and push a key labeled "OK" on the keyboard 45. Then, the CPU 46 determines a region in which a corresponding land is to exist (i.e. a land extracting region 48) in dependence on the type, electrode orientation of the part 27c and the position and shape of the part profile frame 57.

Figure 16:
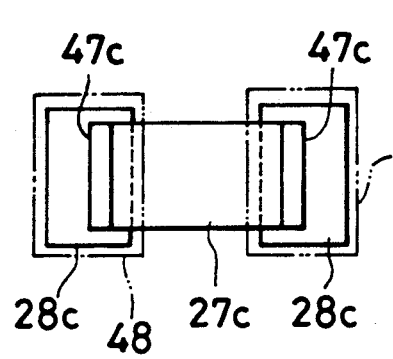
FIG. 16 is a schematic view for illustrating extraction of mounting lands for a resistor or the like part.
Figure 18A:
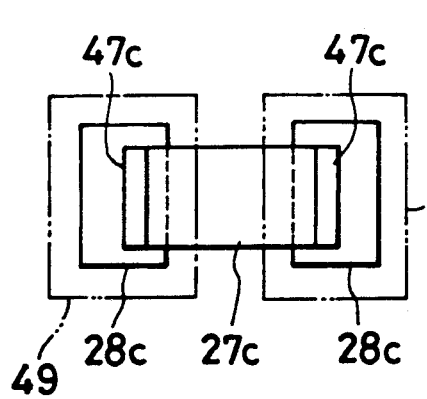
FIGS. 18(A) and 18(B) are schematic views showing enlarged land extracting regions for the abovementioned parts (resistor and transistor), respectively.

In this case, when the part 27c is a double-electrode part such as a resistor and a diode, the land extracting region 48 which covers the electrodes 47c formed at both ends of the part 27c and extending outwardly beyond the profile of the part 27c is determined, as is shown in FIG. 16. Subsequently, the CPU 46 enlarges the land extracting region 48, as illustrated in FIG. 18(A), the data of the resulting land extracting region 49 being stored in the memory.

Figure 17:
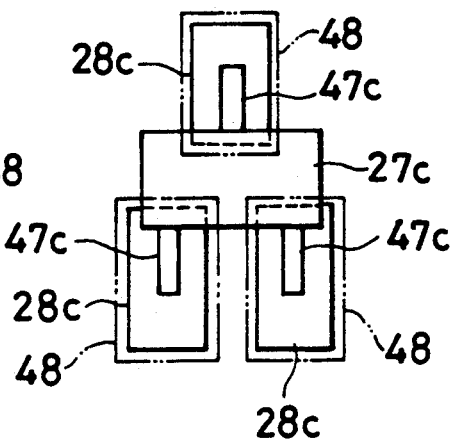
FIG. 17 is a schematic view for illustrating extraction of mounting lands for a transistor or the like part.
Figure 18B:
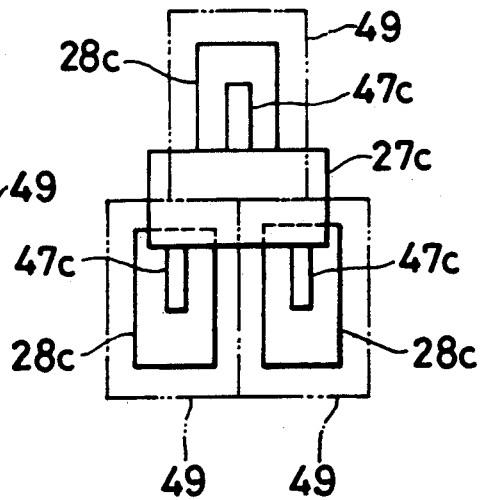

On the other hand, when the part 27c is a triplet-electrode part such as a transistor, the land extracting region 48 which covers all the electrodes 47c of the part 27c and extends outwardly beyond the profile of the part 27c, as shown in FIG. 17, is determined. Subsequently, the land extracting region 48 is enlarged to create an enlarged extracting region 49, as illustrated in FIG. 18(B) through the processing by the CPU 46. The data of the enlarged land extracting region 49 is then stored in the memory 37.

Figure 19A:
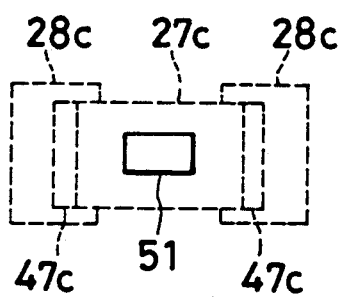
FIG. 19(A) and 19(B) are schematic views showing part body inspecting regions, respectively.
Figure 19B:
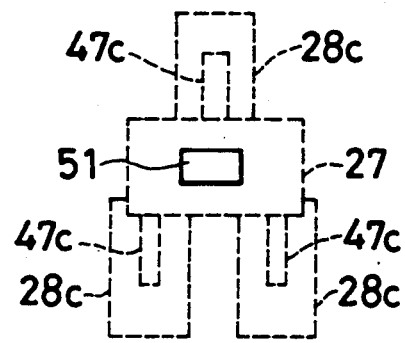

At a step ST10, the CPU 46 arithmetically determines a part body inspecting region 51 used for cutting out a center portion of the part 27c, as shown in FIGS. 19(A) and 19(B), on the basis of the position and shape data of the part profile frame 57 for the part 27c, the data of the part body inspecting region 51 being stored in the memory 37.

Subsequently, the CPU 46 supplies the color image data of the reference packaged substrate 24 and the aforementioned data of part body inspecting region 51 to the image processor 39 from the memory 37, to thereby allows a color image of the part body inspecting region 51 to be cut out from the color image of the reference packaged substrate.

Thereafter, the CPU 46 issues a chrominance/brightness conversion command to the image processor 39 for thereby causing the latter to perform the chrominance/brightness conversion for every pixel (picture elements) constituting the color image of the part body inspecting region 51 in accordance with chrominance/brightness conversion equations, exemplified by the following:

$$BRT(i,j) = R(i,j) + G(i,j) + B(i,j) \quad (1)$$

$$Rc(i,j) = R(i,j)/BRT(i,j) \quad (2)$$

$$Gc(i,j) = G(i,j)/BRT(i,j) \quad (3)$$

$$Bc(i,j) = B(i,j)/BRT(i,j) \quad (4)$$

where
- R (i, j) represents the intensity of R-signal component of the pixel (i, j) located at an intersection of the i-th row and the j-th column,
- G (i, j) represents the intensity of G-signal component of the pixel (i, j) located at an intersection of the i-th row and the j-th column,
- B (i, j) represents the intensity of B signal component of the pixel (i, j) located at an intersection of the i-th row and the j-th column,
- BRT (i, j) represents the brightness of the pixel (i, j), represents a coefficient,
- Rc (i, j) represents red chrominance component of the pixel (i, j),
- Gc (i, j) represents green chrominance component of the pixel (i, j), and
- Bc (i, j) represents blue chrominance component of the pixel (i, j).

Upon completion of the abovementioned chrominance-to-brightness conversion for all the pixels within the body inspecting region 51, the CPU 46 decides discriminatively the colors of the pixels existing in each part body inspecting region 51 on the basis of the result of the above chrominance/brightness conversion. The identified color data (body color) are stored in the memory 37.

Thereafter, the CPU 46 checks whether the abovementioned processing has been completed for all the parts 27c located in the area being currently processed at a step ST11. If any part remains not undergone the processing, the CPU regains the step ST7 from the step ST11 to execute the processing for all the remaining parts in the manner described above.

Upon completion of operation of creating the land extracting regions 49 and extracting the body color for all the parts 27c located within the area being currently processed, the CPU 46 branches from the step ST11 to a step ST12 where it is checked whether the abovementioned processing has been performed for all the areas to be processed. If there remains any area not yet processed, the step ST6 is regained to repeat the processing for the remaining area.

When the land extracting region creating operation and the body color extracting operation have been completed for the parts of all the area subjected to the processing, the CPU exits the processing routine. Thereafter, the CPU 46 rotates the X-Y table 18 in the forward direction to feed the reference packaged substrate 24 to the unloader 66 while causing the loader 65 to place a non-packaged substrate 25 on the conveyor belt mechanism 71.

When the non-packaged substrate 25 is placed on the X-Y table 18, the CPU 46 controls the X-Y table 18 to position a first area to be processed of the non-packaged substrate 25 beneath the color TV camera 34, while causing the monitor 43 to display in the graphic display area thereof a processing frame 56 indicating the current area to be processed together with the part profile frames 57 at a step ST13.

Now, the CPU 46 commands the color TV camera 34 to image the first area to be processed of the non-packaged substrate 25, wherein the resulting color image signals R, G, B are subjected to the A/D conversion, the data resulting from the conversion (color image data of the non-packaged substrate 25) being stored in the memory 37 on the real time basis.

The color image data of the non-packaged substrate produced by the A/D converter 36 are also supplied to the monitor 40 to be displayed on the screen thereof.

Next, the CPU 46 reads out the profile frame data for a first part from the memory 37 at a step ST14, which data is supplied to the monitor 43, whereby a part profile (contour) frame 57 corresponding to the part profile frame data is displayed in green, as shown in FIG. 15(C).

Then, the CPU 46 reads out from the memory 37 an enlarged land extracting region 49 for the part 27c corresponding to the abovementioned part profile frame data together with the color image data of the non-packaged substrate 25, the data thus read out being supplied to the image processor 39 for allowing the color image for the land extracting region 49 to be cut out from the color image data.

Subsequently, the CPU 46 issues the chrominance/brightness conversion command to the image processor 39 for making the latter perform the chrominance/brightness conversion for the individual pixels constituting the color image of the land extracting region 49 and checks whether the red chrominance signals Rc (i, j) of all the pixels (i, j) within the land extracting region 49 exceed a land extracting reference value C (e.g. $C=0.4 \cdot \alpha$) which has been previously loaded.

Figure 20A:
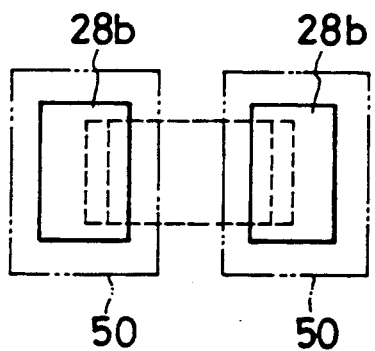
FIGS. 20(A) and 20(B) are schematic views showing land inspecting regions for the individual parts, respectively.
Figure 20B:
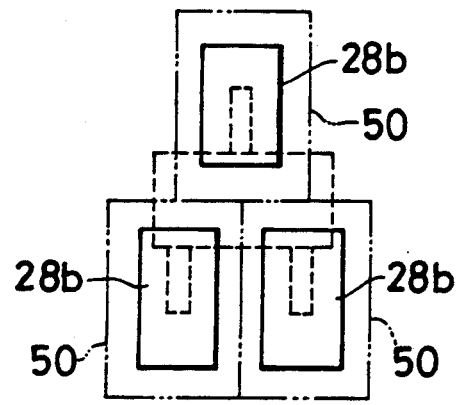

When there exist the pixels of which red chrominance signal Rc (i, j) exceeds the land extracting reference value C, the area constituted by these pixels is determined as a land 28c at a step ST15, being followed by a step ST16 where the data concerning this land 28c (referred to as the land data) is supplied to the monitor 40 to be displayed as the land 28b in brown on the screen, as shown in FIG. 15(C). Thereafter, the land 28b is enlarged, as illustrated in FIGS. 20(A) and 20(B) to establish the land inspecting region 50, whose data is then stored in the memory 37.

Unless the red chrominance signal Rc (i, j) of the individual pixels exceed the land extracting reference value C in the step ST15, the CPU 46 decides that the land 28b is not present, whereupon the routine jumps to the step ST17 where the part profile frame data for this area is supplied to the monitor 43. In response, the inner region of the part profile frame 57 corresponding to the abovementioned part profile frame data is colored in red, as shown in FIG. 15(D). Thereafter, the land extracting region 49 is stored as the land inspecting region 50 in the memory 37.

At a succeeding step ST18, the CPU 46 supplies the color image data of the non-packaged substrate 25 together with the part body inspecting region 51 to the image processor 39 from the memory 37 for allowing the color image of the part body inspecting region 51 to be cut out from the color image data.

The CPU 46 then issues a chrominance/brightness conversion command to the image processor, whereupon the chrominance/brightness conversion is performed for the individual pixels constituting the color image of the part body inspecting region 51. After discrimination of the color of the pixels within the part body inspecting region 51, the corresponding color data (i.e. data of color in the non-packaged state) are stored in the memory 37.

At a step ST19, it is checked by the CPU 46 whether the abovementioned processing has been performed for all the part profile frame data of the area of concern. If there remains the part profile frame data which has not yet undergone the processing, the step ST14 is regained from the step ST19 to perform the aforementioned processing for the remaining part profile frame data.

Upon completion of the land (28b) detection processing and the non-packaged state color detection processing for all the part profile frame data belonging to the area of concern, the CPU 46 branches from the step ST19 to a step ST20 where it is checked whether the aforementioned processing has been made for all the areas to be processed. If there remain any areas not processed, the step ST13 is regained from the step ST20, whereupon the aforementioned processing is performed for the remaining areas.

When the land detection processing and the non-packaged state color detection processing for all the part profile frame data of all the areas subjected to the processing have been completed, the CPU 46 proceeds to a step ST21 from the step 20. In the step ST21, data of the land inspecting regions 50, the body inspecting regions 51, the body colors shapes of the lands 28b, the color in the non-packaged state and additionally data of the alarm condition, the substrate name, the substrate size and others are rearranged for each of the parts to prepare a file, which is then stored in the table 38. The teaching routine thus comes to an end.

At the end of the teaching operation, a test running mode is activated. Then, the CPU 46 rotates the X-Y table 18 in the reverse direction to return the non-packaged substrate 25 to the loader 65 while allowing the reference packaged substrate 24 to be returned onto the conveyor belt mechanism 71 from the unloader 66.

Figure 8:
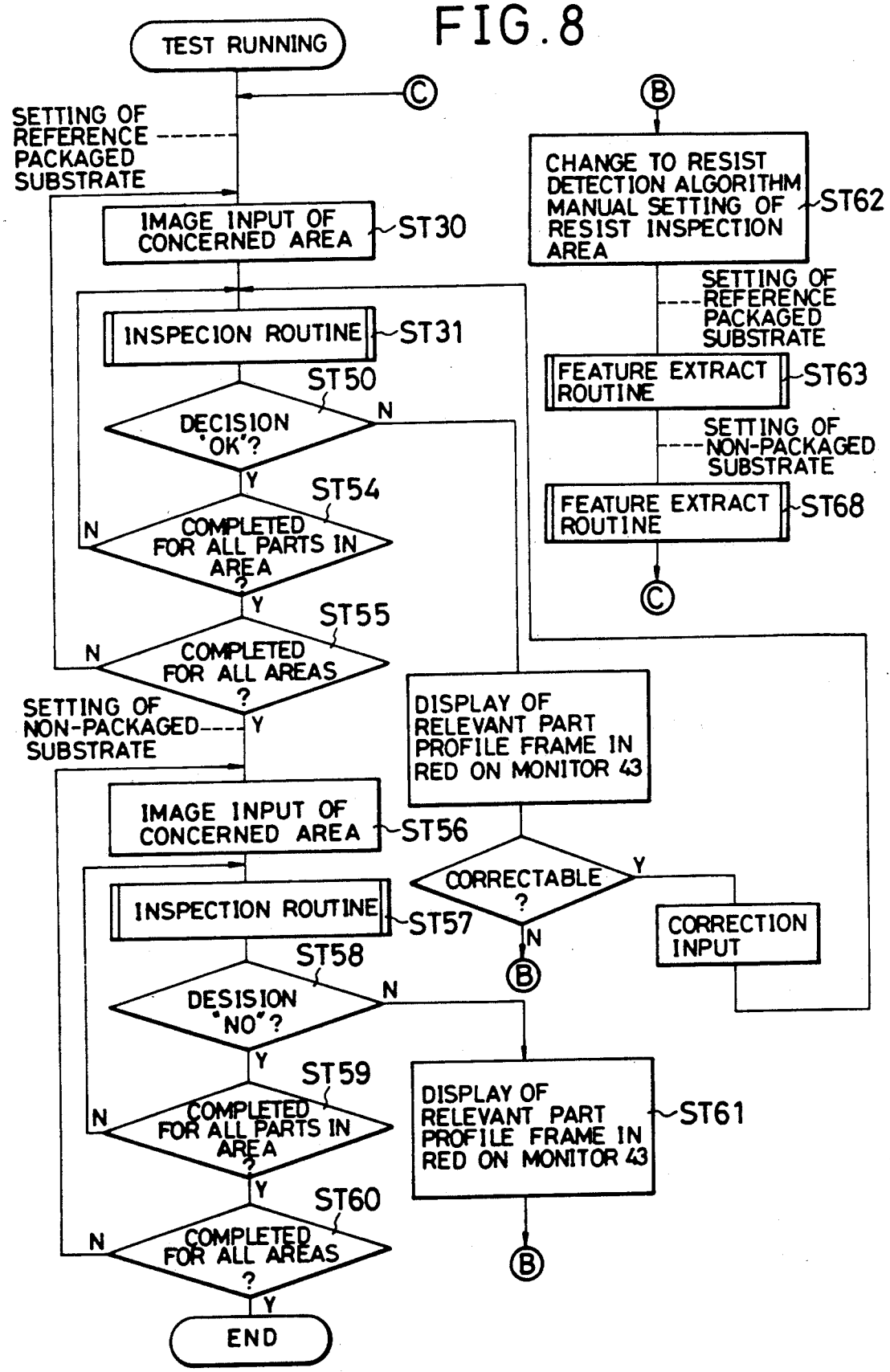
FIG. 8 is a view illustrating in a flow chart a test running operation for determining the mounted state of parts on a substrate by the packaged substrate inspecting apparatus.

Now, reference is made to FIG. 8 which shows the test running flow chart. At a step ST30, the CPU 46 controls the X-Y table 18 so that a first area to be processed of the reference packaged substrate 24 is positioned below the color TV camera 34, while causing the monitor 43 to display a processing frame 56 indicating the current area to be processed (i.e. the first area) in the graphic display area 52 together with the individual part profile frames 57.

Next, the CPU 46 commands the color TV camera 34 to pick up the image of the first area to be processed of the reference packaged substrate 24, wherein the resulting color video signals R, G, G undergo A/D conversion through the A/D converter 36, the data resulting from the A/D conversion (color video data of the reference packaged substrate 24) being stored in the memory 37 on the real time basis.

Further, the color video data of the reference packaged substrate 24 resulting from the abovementioned A/D conversion are also supplied to the monitor 40 to be displayed thereon, as shown the FIG. 14(D).

Figure 9:
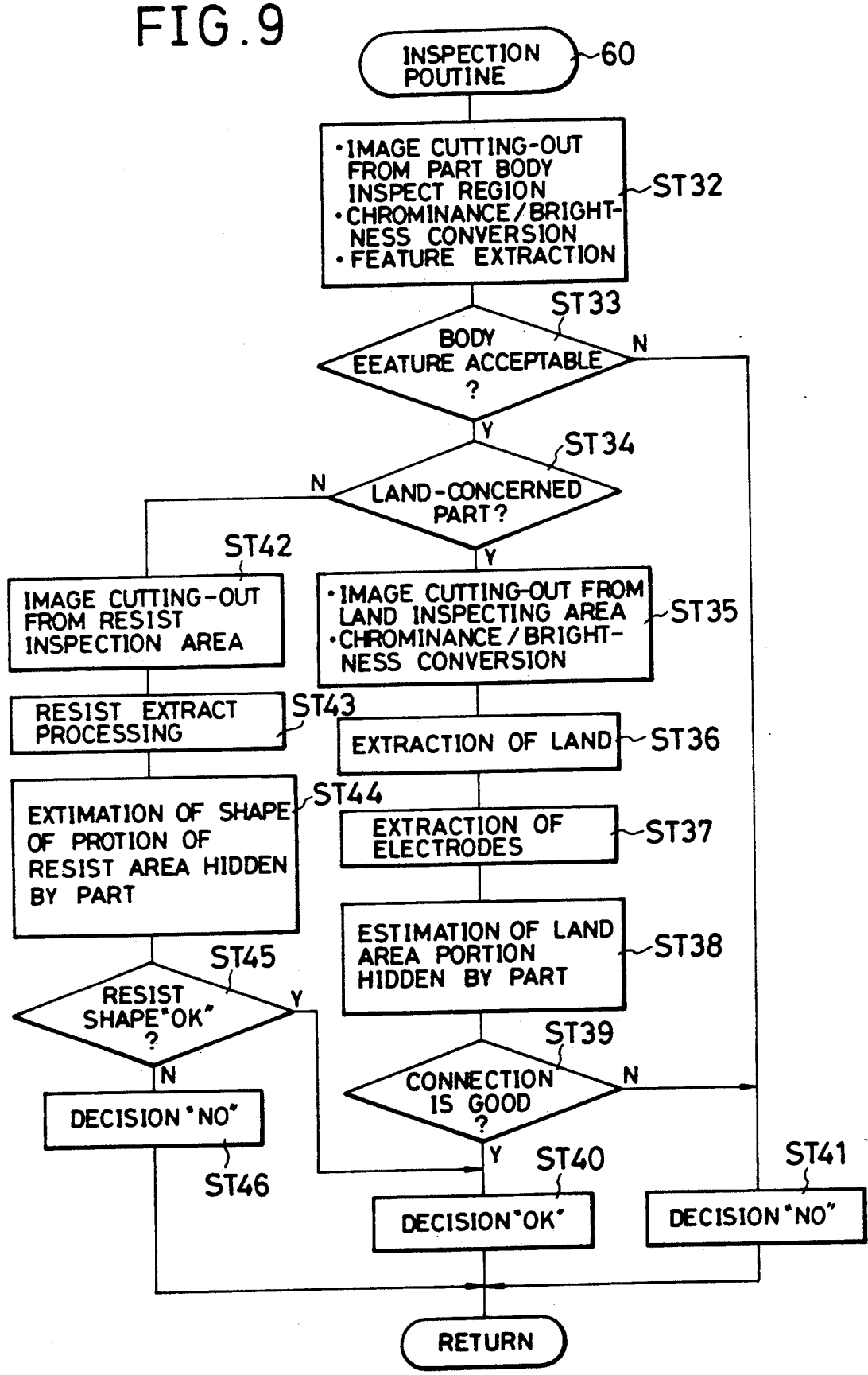
FIG. 9 is a view illustrating in a flow chart a procedure executed for inspecting the mounted state of parts on a substrate by the packaged substrate inspecting apparatus.
Figure 10:
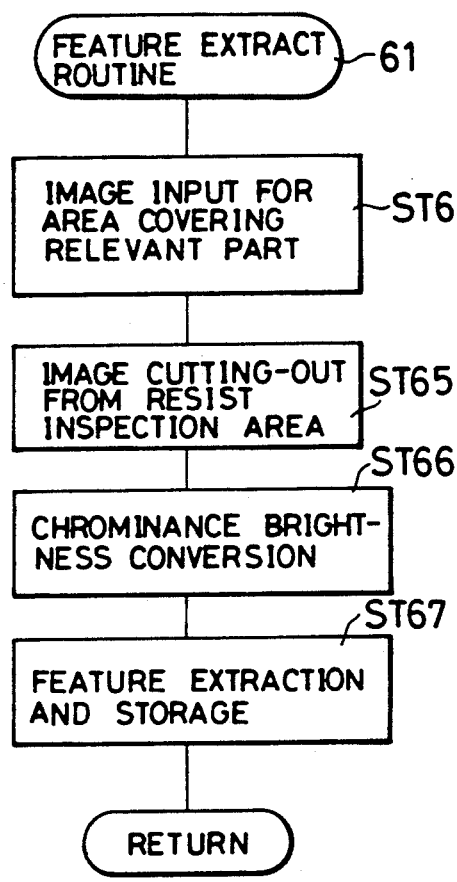
FIG. 10 is a view illustrating in a flow chart a feature data extracting operation performed in the course of the part-mounted state decision procedure.

Next, at a step 31, the CPU 46 calls an inspection routine shown in FIG. 9. At a step ST32 of this inspection routine, a first part body inspection region 51 located within the area being processed currently is read out from the table 38 to be supplied to the monitor 43, whereby the inner area of the part profile 57 corresponding to the part body inspecting area 51 is displayed in green. Thereafter, the abovementioned part body inspecting region 51 and the color video data of the reference packaged substrate stored in the memory 37 are supplied to the image processor 39 to thereby allow the color image of the part body inspecting region 51 to be cut out from the color video data.

Then, the CPU 46 issues chrominance/brightness conversion command to the image processor 39, whereby the individual pixel signals constituting the color image cut out from the part body inspecting region 51 undergo the chrominance/brightness conversion, being followed by determination of the color of the pixels located within the part body inspecting region 51.

At a next step ST33, the CPU 46 makes decision as to whether the image color of the part body inspecting region 51 is that of the part body or that in the non-packaged state. If the color of the image in the part body inspecting region 51 coincides with that of the part body, the routine branches from the step ST33 to a step ST34 where the inspection algorithm for the part for the part body inspecting region 51 is checked.

Since the part inspection algorithm is not altered in the test running mode, the CPU 46 steps up to the step ST35 from the step ST34 and reads out the land inspecting region 50 corresponding to the aforementioned part body inspecting region 51 from the table 38 to be subsequently supplied to the image processor 39. At the same time, the color video data of the reference packaged substrate 24 stored in the memory 37 is also supplied to the image processor 39 to thereby allow the image of the land inspecting region 50 from the color image data.

At this stage, the CPU 46 issues a command for chrominance/brightness conversion to the image processor unit 39, whereby the individual pixels constituting the aforementioned land inspecting region 50 undergo the chrominance-to-brightness conversion.

Upon completion of the chrominance/brightness conversion mentioned above for all the pixels within the land inspecting region 50, the CPU 46 checks at a step ST36 whether the red chrominance signal Rc (i,j) for each pixel (i,j) within the land inspecting region 50 exceeds a preset land extraction reference value C (e.g. C may be selected equal to 0.4·a), to thereby extract to portion of the land 28c which is not covered by the body and the electrodes 47c of the part 27c (land region).

Subsequently, the CPU 46 checks at a step ST37 whether the brightness BRT (i,j) of each pixel within the land inspecting region 50 exceeds a preset reference value D for extraction of electrodes to thereby extract the electrodes 47c from the land inspecting region 50.

At a step ST38, the CPU 46 makes comparison of the position and shape of the aforementioned land region with those of the land 28b of the non-packaged substrate 25 stored in the table 38 to arithmetically determine (estimate) the portion of the land 28c which is hidden by the body and electrodes 47c of the part 27c.

Figure 21A:
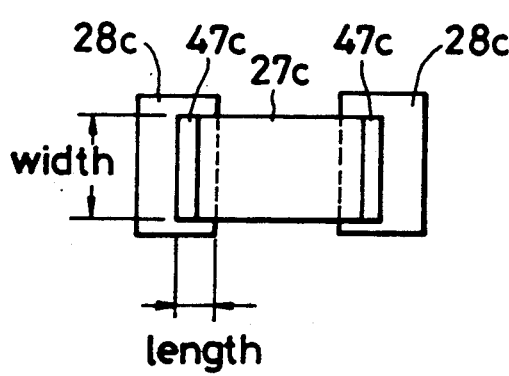
FIGS. 21(A) and 21(B) are schematic views for illustrating a decision process made on the positional relationship between part mounted on a substrate and a mounting land therefor.
Figure 21B:
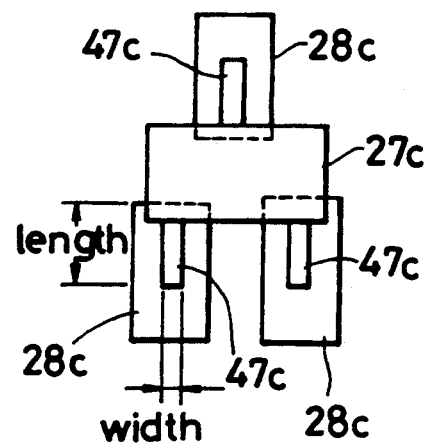

At a step ST39, the CPU 46 utilized the results of the arithmetic determination to determine the coverage area data (the data of area of the land 28c covered by the body and electrodes 47c of the part 27c), the width data and the length data which indicate the positional relationship between the land 28c and the part 27c, as shown in FIGS. 21(A) and 21(B). Additionally, it is checked if the values of these data are appropriate.

In this connection, it is assumed that the part 27c is a transistor. In this case, the electrodes 47c do not jut out from the associated land 28c in the direction lengthwise (in the X-direction in FIG. 22A) with the electrodes 47c overlapping the lands 28c at least partially in the direction widthwise (in the Y-direction in FIG. 22A).

Figure 22A:
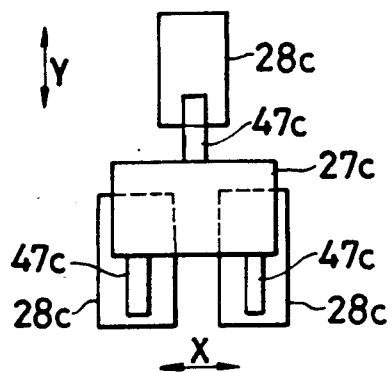
FIGS. 22(A), 22(B) and 22(C) are schematic views for illustrating, by way of example, possible positional relationships resulting from the decision made for the case shown in FIG. 21(A)
Figure 22B:
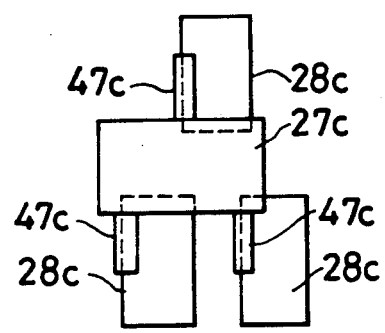
Figure 22C:
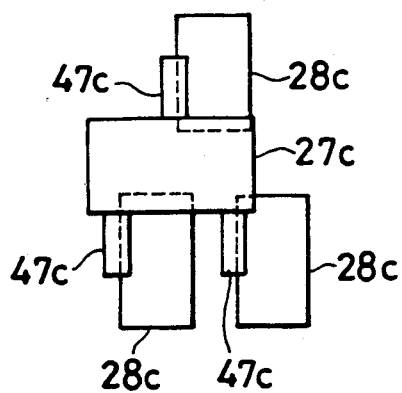

On these conditions, it is decided that a satisfactory connection is realized between the transistor and the associated lands on the substrate. More specifically, when such a positional relationship as shown in FIG. 22(A) exists between the part 27c and the lands 28c, decision is made that satisfactory connection is realized. On the other hand, the positional relationships illustrated in FIGS. 22(B) and 22(C) tell the unsatisfactory connection.

Figure 23A:
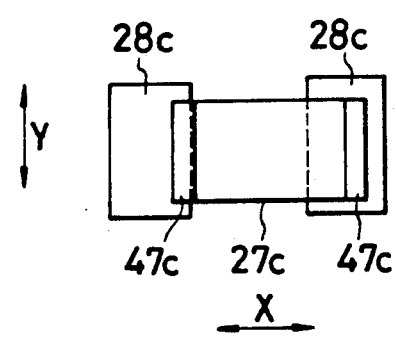
FIGS. 23(A), 23(B), 23(C) and 23(D) are schematic views for illustrating examples of the positional relationship which may result from the decision made for the case shown in FIG. 21(B)
Figure 23B:
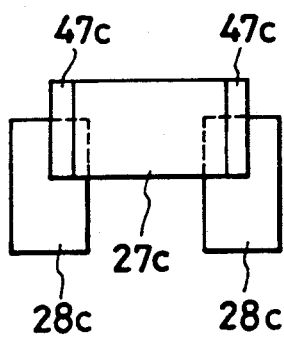
Figure 23C:
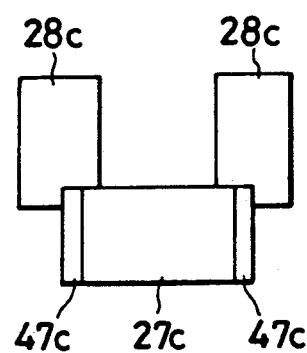
Figure 23D:
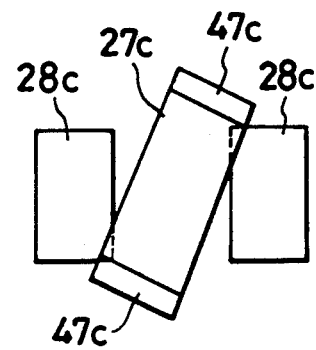

Let's assume that the part 27c is a resistor. In this case, decision is made such that the satisfactory connection is realized when the electrodes 47c do not jut out from the associated lands 28c in the direction lengthwise (i.e. in the X-direction in FIG. 23A) with the electrodes 47c overlapping the lands 28c in ratio of ⅔ in the widthwise direction (i.e. in the Y-direction in FIG. 23A). Accordingly, such a positional relationship between the part 27c and the lands 28c as shown in FIG. 23(A) or 23(B) shows the satisfactory connection, while the positional relationship shown in FIG. 23(C) or (D) shows inadequate connection.

When the satisfactory connection of the part 27c is determined, the CPU 46 proceeds to a step ST40 from the step ST39, where the result of decision of the satisfactory connection is stored in the memory 37.

Further, when the image color in the part body inspecting area 51 coincides with that of the non-packaged substrate or unless the connection between the part 27c and the lands 28c are satisfactory, as found in the step ST33 or ST39, the CPU 46 proceeds to a step ST41 where decision is made that the mounted state of the part 27c is unacceptable.

Operation in connection with the steps ST42 to ST46 of the inspection routine 60 will hereinafter be described in detail.

Upon completion of the inspecting routine 60, the CPU 46 regains the step ST50 of the test running flow described hereinbefore. At this step ST50, the result of decision made for the mounted state of the part 27c is read out from the memory 37. When it is found that the part 27c suffers the faulty mount, the CPU 46 proceeds to a step ST51 from ST50.

At the step ST51, the part profile frame data of the concerned part 27c is supplied to the monitor 43 and the inner area of the part profile frame 57 is displayed in red on the monitor 43, as shown in FIG. 15(D). Subsequently, at a step ST52, a message is displayed on the monitor 43 in the operation procedure indicating area thereof, asking the operator if the part 27c corresponding the part profilo frame 57 displayed in red can be corrected.

In response, the operator makes decision whether the part 27c of concern can be corrected by observing the image thereof video-displayed on the screen of the monitor 40 and the graphically displayed part profile frame 57. When the species of the part or electrode orientation thereof is registered erroneously or when the part profile frame 57 inputted by using the teaching substrate 23 is deviated from the profile of the part 27c mounted on the reference packaged substrated 24, operator can press the correction request key on the keyboard 45. Then, the CPU 46 proceeds to a step ST53 from the step ST52 and remains in the state for waiting for data inputting.

Now, the operator may place another reference packaged substrate 24 having the part 27c mounted correctly on the X-Y table 18 in place of the preceding one or alter the species of the part 27c and the electrode orientation thereof by means of the species changing key and the orientation changing key or alter the position and shape of the part profile frame 57 so that the image of the part 27c displayed on the monitor 40 may overlap the part profile frame 57 with the aid of the enlarging key, contracting key and/or parallel displacing key. Thereafter, operator presses a correction end key. In response, the CPU 46 correspondingly corrects the species data, orientation data, position data, shape data, land inspecting area data and others for the part 27c and then regains the step ST31 where the part 27c can be again checked as to the mounted state in the manner described hereinbefore.

On the other hand, when the operator pushed a correction incapability key based on the judgement that the part 27c corresponding to the part profile frame 57 displayed in red on the monitor 43 in the graphic display area 52 thereof can not be checked with the land-jumps directed algorithm, the CPU 46 jumps to a step ST62 from the step ST52.

At the step ST62, the CPU 46 commands the monitor 43 to display in the operation procedure indicating area 53 thereof a message that the land detection mode has been changed over to a resist detection mode together with a message prompting the operator to set manually a resist inspecting area, threshold value and other.

Figures 24A, 24B:
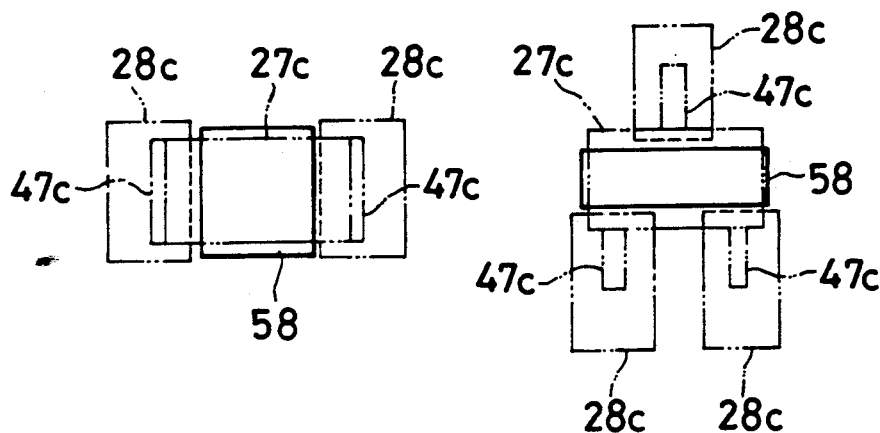
FIGS. 24(A) and 24(B) are schematic views showing, by way of example, resist inspecting regions for associated parts, respectively.
Figure 25:
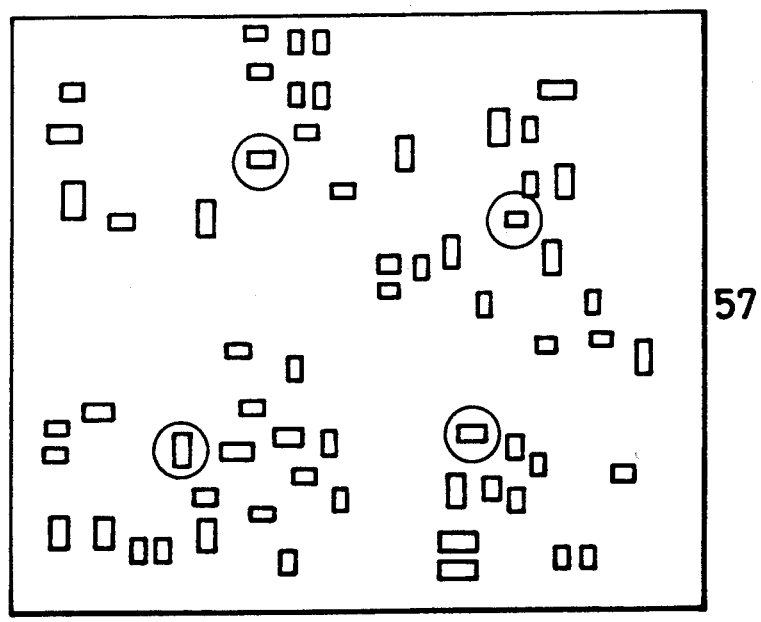
FIG. 25 is a schematic view showing an example of print.

Accordingly, the operator can manually set a resist inspecting area 58, as shown in FIG. 24(A) or 24(B), by means of the enlarging key, contracting key and/or parallel displacing key while observing the image of the part 27c displayed on the monitor 40 comparatively with the part profile frame 57 displayed graphically. In response, the CPU 46 stores the data of the resist inspecting area 58 in the table 38, being followed by the step ST63 where it is checked whether the reference packaged substrate 24 is set on the X-Y table 18.

Since the reference packaged substrate 24 has been already set on the X-Y table 18 at this time point, the CPU 46 calls the feature extracting routine 61. At the step ST64 of this feature extracting routine 61, the X-Y table 18 is so controlled that the area to be processed (the first area to be processed) including a part 27a and having the resist inspecting area 58 is disposed below the color TV camera 34, while commanding the monitor 43 to display in the graphic display area 52 thereof the processing frame 56 indicative of the area being currently processed.

Subsequently, the concerned area of the reference packaged substrate 24 is imaged by the color TV camera 34 under the command of the CPU a46, wherein the resulting color video signals R, G, B undergo A/D conversion through the A/D converter 36. The result of the A/D conversion (i.e. color image data of the reference packaged substrate 24) is stored in the memory 37 on the real time basis.

At the same time, the color image data resulting from the A/D conversion (36) are also supplied to the monitor 40 to be displayed thereof.

Next, at a step ST65, the CPU 46 reads out the resist inspecting area 58 for the part 27c from the table 38 while reading out the color image data of the reference packaged substrate 24 from the memory 37. These image data are transferred to the image processor 39, wherein the color image of the resist inspecting area 58 is cut out from the color image data.

At a next step ST66, the CPU 46 issues a chrominance/brightness conversion command to the image processor 39 to cause the latter to perform the chrominance/brightness conversion for the individual pixels constituting the cut-out color image of the aforementioned resist inspecting area 58. At a step ST67, color of the individual pixels located within the resist inspecting area 58 is decided on the basis of the result of the chrominance/brightness conversion. From the result of the color decision, the color of the resist portion (resist color) of the resist inspecting area 58 and the shape at the time of the mount the part are determined and stored in the table 38.

Then, the CPU 46 regains the step ST68 of the test running flow described hereinbefore, where the X-Y table 18 is rotated forwardly to transfer the reference packaged substrate 24 to the unloader 66, while the non-packaged substrate 25 is placed onto the conveyor belt mechanism 71 from the loader 65.

Now, the CPU 46 executes again the feature extracting routine 61 described hereinbefore to determine the color of the resist portion of the resist inspecting area in the non-packaged state and the shape thereof, the data of color and shape thus determined being stored in the table 38. Thereafter, the step ST30 is regained.

In this step ST30, the CPU 46 waits for disposition of the reference packaged substrate 24 on the X-Y table, whereupon the X-Y table 18 and the color TV camera 34 are so controlled by the CPU 46 as to pick up the image of the area (the first area being processed) covering the part 27c for which the resist inspecting area 587 is set, the resulting color image data of the concerned area being stored in the memory 37 on the real time basis.

At the same time, the color image of the concerned area is supplied to the monitor 40 to be displayed thereon.

Subsequently, the CPU 46 executes the inspection routine described hereinbefore at a step ST31. However, since the resist inspecting mode is set for the part 27c, it is decided that the inspection algorithm is changed upon execution of the step ST34 of the inspection routine 60 when the color of image within the part body inspecting area 51 coincides with that of the part body determined in the teaching routine. Accordingly, the CPU 46 jumps to a step ST42 from the step ST34.

In the step ST42, the CPU 46 reads out the resist inspecting area 58 corresponding to the part body inspecting area 51 from the table 38, which area 58 is supplied to the image processor 39. At the same time, the latter is supplied with the color image data of the reference packaged substrate 24 from the memory 37. Thus, the image processor 39 cuts out the color image of the resist inspecting area 58 from the color image data.

Subsequently at a step ST43, the CPU 46 issues a chrominance/brightness conversion command to the image processor 39 to cause the latter to perform the chrominance/brightness conversion for the individual pixels constituting the image of the aforementioned resist inspecting area 58. Thereafter, of the pixels (i, j) undergone the chrominance/brightness conversion, those having the color coinciding with the resist color are extracted.

At a next step ST44, the CPU 46 compares the shape of the resist portion with that of the resist portion in the non-packaged state as stored in the memory 38 to thereby determine the shape of the portion (resist shape) not hidden by the body and electrodes 47c of the part. Thereafter, at a step ST45, the resist shape is compared with the non-packaged state resist shape stored in the table 38, and it is checked whether the difference between both the resist shapes lies within a permissible range.

When the difference of concern lies within the permissible range, the CPU 46 branches to the step ST40 from the step ST45. At the step ST40, it is decided that the part 27c corresponding to the resist inspecting area 58 is mounted satisfactorily. The result of this decision is stored in the memory 37.

On the other hand, unless the difference between the aforementioned resist shape and the one stored in the table 38 is in the permissible range, the CPU 46 proceeds to a step ST46 from the step ST45, and decision is made that the part 27c corresponding to the resist inspecting region 58 is not mounted acceptably. The result of this decision is also stored in the memory 37.

The CPU 46 then exists from the inspecting routine 60 and resumes the step ST50 of the test running flow, where the result of the decision concerning the mounted state of the part 27c is read out from the memory 37. If the part 27c is found faulty in the mounted state, the CPU 46 proceeds to a step ST62 from the step ST50 through the steps ST51 and ST52, whereby the aforementioned operation is again executed to re-establish the resist inspecting area, whereupon the procedure described above is repeatedly executed to decide whether the resist inspecting area 58 is to be satisfied or not.

On the other hand, if it is decided that the part 27c is mounted correctly, the CPU 46 jumps to the step ST54 from the step ST50. At the step ST54, it is checked whether the aforementioned processing has been completed for all the parts 27c located within the first area subjected to the processing. If there remains any part for which the processing is not performed yet, the step ST31 is regained, where the aforementioned processing is executed for the remaining parts 27c.

Upon completion of the processing described above for all the remaining parts 27c within the first area subjected to the processing, the CPU 46 proceeds to a step ST55 from the step ST54, and it is checked whether the processing described above has been completed for all the areas of concern. If any areas remain not processed, the step ST30 is regained, and the processing described above is executed.

Figure 11:
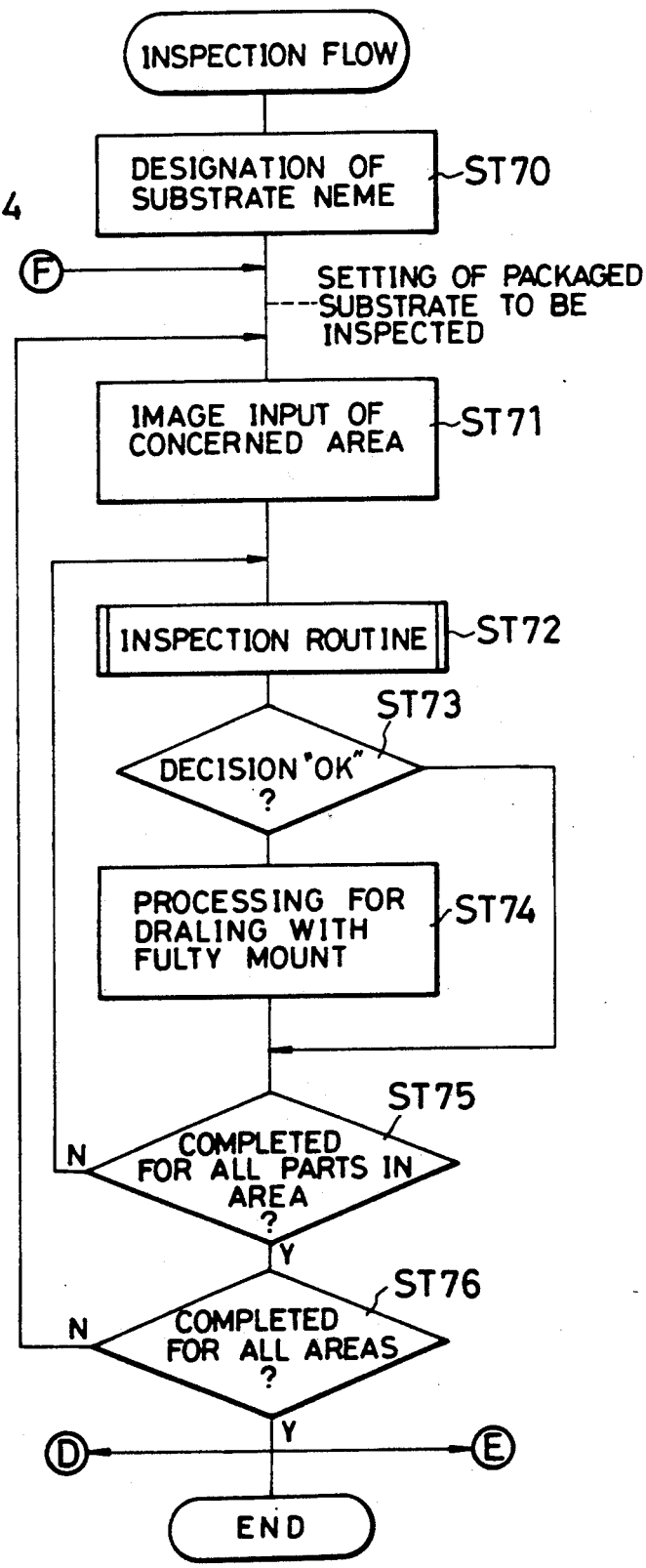
FIG. 11 is a view illustrating in a flow chart an inspection routine executed in the course of the part-mounted state decision procedure.

Unless all the part profile frames 57 displayed in the graphic display area 52 on the monitor 43 as shown in FIG. 11 at the time when the processing described above has been completed for the parts 27c in all the areas of concern, the CPU 46 exists from the current loop, and rotates the X-Y table 18 in the forward direction to transfer the reference packaged substrate to the unloader 66, while allowing the non-packaged substrate 25 to be placed on the conveyor belt mechanism 71 from the unloader 65.

Now, at the step ST56, the CPU 46 controls the X-Y table 18 so that a first area subjected to the processing of the non-packaged substrate 25 is positioned below the color TV camera 34. A processing frame 56 of the area being currently processed (i.e. the first area) is displayed in the graphic display area 52 on the monitor 43.

Subsequently, the concerned first area of the non-packaged substrate 25 is imaged by the color TV camera 34 under the command of the CPU 46, wherein the resulting color video signals R, G, B undergo A/D conversion through the A/D converter 36. The result of the A/D conversion (i.e. color image data of the non-packaged substrate 25) is stored in the memory 37 on the real time basis.

Figure 14E:
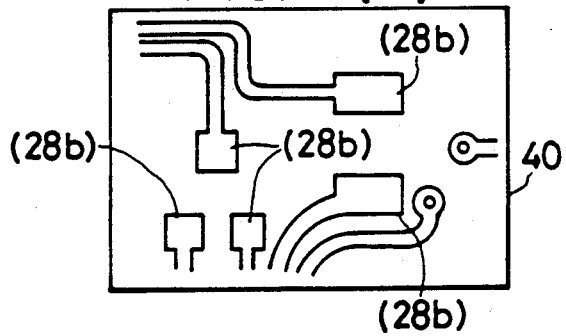
Figure 14C:
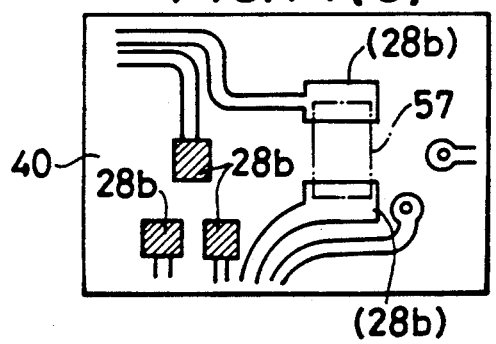

At the same time, the color image data of the non-packaged substrate 25 resulting from the A/D conversion (36) are also supplied to the monitor 40 to be displayed thereon, as is shown in FIG. 14(E).

Next, the CPU 46 executes the inspecting routine 60 at a step ST57 to determine the mounted state of a first part located within the first area being processed. At a step ST58, it is checked whether the mounted state of this part is to be satisfied or not.

When the part of concern is mounted correctly, the CPU 46 makes decision that the algorithm for inspection of this part is incorrect, and jumps to a step ST61 from the step ST58. At the step ST61, the part profile frame data for this part is supplied to the monitor 43, whereby the part profile frame 57 of concern is displayed with the inner area colored in red.

Thereafter, the CPU 46 executes the steps ST62 to ST68 to establish the resist inspecting area 58 and the threshold value optimal for this part. Further, the shape and color of the packaged resist area corresponding to the resist inspecting area 58 as well as the shape and color of the non-packaged resist area are extracted to be stored in the memory. Thereafter, the step ST30 is regained.

Through the steps ST30 to ST50, the CPU 46 makes decision as to whether the part 27c corresponding to the resist inspecting region 58 of those mounted on the reference packaged substrate 24 is mounted satisfactorily.

When it is found that the part 27c is in the acceptable mounted state, the CPU 46 examines the mounted state corresponding to the aforementioned resist inspecting area 58 on the non-packaged substrate 25 at the steps ST56 and ST57 to make decision whether the part is decided to be in the faulty mounted state at the step ST58.

When the part of concern is found mounted correctly, the CPU 46 jumps to a step ST62 from the step ST58 over the step ST61. At the step ST62, the operation described above is executed again to re-establish the resist inspecting area 58 and the threshold value, whereupon the aforementioned operation is repeated to make decision as to acceptability of the current resist inspecting area 58.

When the part corresponding to the abovementioned resist inspecting area 58 is decided to be in the faulty mount state at the step ST58, the CPU 46 jumps to a step ST59 from the step ST58. At the step ST59, it is checked whether the processing described above has been completed for all the parts located within the first area being currently processed. If any parts remain not processed yet, the step ST57 is regained, whereupon the aforementioned processing is performed for the remaining parts.

Upon completion of the processing for all the remaining parts within the first processing area, as shown in FIG. 14(F), the CPU 46 proceeds to a step ST60 from the step ST59 and checks whether the processing described above has been completed for all the areas to be processed. Any areas remaining not processed yet are then processed in the same manner at the step ST56.

When all the part profile frames 57 displayed in the graphic display area 52 on the monitor 43 are solidly colored in red upon completion of the processing described above for all the parts of all the areas of concern, the CPU 46 exits from this test running operation routine.

When the inspection mode is activated at the end of the teaching operation, the CPU 46 displays on the monitor 43 a message prompting the operator to enter the identification number or name of the packaged substrate to be inspected at a step ST70 in the inspection flow chart shown in FIG. 11.

When the substrate name is inputted through the keyboard 45, the CPU 46 waits for disposition of the packaged substrate to be inspected on the X-Y table 18.

When the packaged substrate 26 to be inspected is disposed on the X-Y table 18, the CPU 46 controls the X-Y table 18 so that a first area subjected to the processing of packaged substrate 26 to be inspected is positioned below the color TV camera 34 at a step ST71. A processing frame 56 of the area being currently processed (i.e. the first area) is displayed in the graphic display area 52 on the monitor 43 together with individual part profile frames 57.

Subsequently, the concerned first area of the packaged substrate 26 under inspection is imaged by the color TV camera 34 under the command of CPU 46, wherein the resulting color video signals R, G, B undergo A/D conversion through the A/D converter 36. The results of the A/D conversion (i.e. color image data of the packaged substrate 26) are stored in the memory 37 on the real time basis.

Next, the CPU 46 executes the inspection routine 60 at a step ST72 for examining the mounted state of a first part 27d within the first processing area. At a step ST73, it is checked whether or not the part 27d is mounted correctly. If not, a step ST74 is executed to allow the faulty mount of the part 27d to be stored in the table 38 while displaying the corresponding part profile frame 57 in red on the monitor 43.

On the other hand, when the decision is made such that the part 27d is mounted correctly, the CPU 46 skips the step ST74.

Subsequently, at a step ST75, the CPU 46 checks whether the processing described above has been completed for all the parts 27d located within the first processing area. If any parts remain not processed yet, the step ST72 is regained, for performing the abovementioned processing for the remaining parts 27d.

Upon completion of the processing for all the remaining parts 27d within the first processing area, the CPU 46 proceeds to a step ST76 from the step ST75 to check whether the processing has been performed for all the processing areas. If any area remains not processed, the CPU resumes the step ST71 where the aforementioned processing is performed for the remaining areas to be processed.

When the processing has been completed for all the parts of all the areas to be processed (i.e. processing areas), the CPU 46 jumps from the step ST76 to a step ST77 of the processing routine shown in FIG. 12. At this step, the image displayed in the graphic display area 52 of the monitor 43 is held as it is. At the same time, a sheet of paper printed with the part profile frames 57 of the parts 27d and circular marks enclosing those frames 57 corresponding to the parts of the faulty mount is delivered. Thus, the inspection operation comes to an end.

As will be appreciated, according to the illustrated embodiment, operator can recognize straightforwardly the locations of the faulty parts by virtue of the superposed display of the part profile frame 57 of the individual part and red color (or circular mark) indicating the location of the faulty part.

Although it has been described that a circular mark including the faulty part is printed around the corresponding part profile frame, it should be appreciated that the identification number of the faulty part may be alternatively displayed or printed out.

Further, even when the lands 28d on the packaged substrates to be inspected differ from one to another substrate, the acceptability of the mounted state is determined so far as the part is mounted on the land 28d within permissible tolerance, it is possible to exclude erroneous decision due to error involved in the manufacture of the substrate. Besides, optimum positional deviation can be automatically established for the individual parts, respectively.

In the foregoing description, it has been assumed that the species data of the parts are inputted manually in the teaching routine. However, it is equally possible to detect the lands which can be connected to the part on the basis of the inputted image, for example, of the reference packaged substrate, wherein the species data of the part can be automatically inputted on the basis of the data of the land thus obtained.

In the substrate inspection system according to the illustrated embodiment of the invention which includes an image pick-up unit and a variety of algorithms for inspections, wherein the desired image portion is cut out from the substrate image obtained through the image pick-up unit in accordance with the inspecting algorithm designated for each part, and wherein each image is processed with the inspecting algorithm designated for each part for determining the mounted state of the part, the CPU 46 completes the inspecting operation when the abovementioned processing has been completed for all the parts of all the areas to be processed through the processing operation for regaining the step ST71 from the step ST76 (FIG. 11) (i.e. when the result of the decision step ST76 is "YES").

It should be mentioned that for the part whose mounted state can not be inspected by the land-concerned algorithm (i.e. algorithm relying on the land data), algorithm concerning the resist can be made use of. Thus, the mounted state can be examined for the part of a same color as that of the land.

Figures 26, 27, 28:
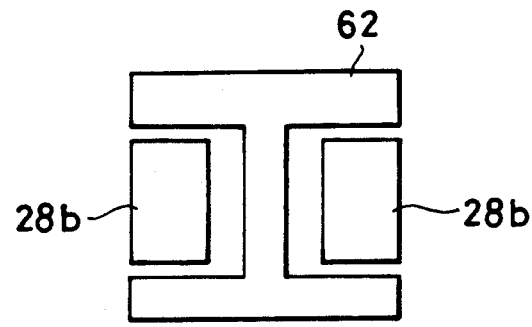
FIG. 26 is a schematic view showing another example of print.
FIG. 27 is a schematic view for illustrating a substrate mark detecting algorithm employed in another operation mode of the packaged device inspecting apparatus according to the present invention.
FIG. 28 is a schematic diagram showing a faulty part file employed in still another operation mode of the packaged substrate inspecting apparatus according to the present invention.

In this connection, it should be added that when the mounted state can not be determined with the resist-concerned algorithm, a third inspection algorithm relying on a substrate mark 62 as shown in FIG. 27 may be adopted.

In order to generate an alarm when the alarming condition is met, the CPU 46 proceeds to the processing routine E to execute a step ST78 upon completion of the aforementioned processing for all the parts of all the processing areas after regaining the step ST71 from the step ST76 (FIG. 11). At the step ST78, data is read out from memory 37 to check whether there is the part 27d decided to be in the faulty mounted state. If such faulty mounted part is present, the CPU 46 proceeds to a step ST79 from the step ST78.

At the step ST79, the CPU 46 reads out the data concerning the faultily mounted part from the memory 37 to prepare a faulty part file in the format shown in FIG. 28, which file is then stored in the table 38.

At a step ST80, the CPU 46 consults the faulty part file stored in the table 38 to check if the alarm condition is satisfied. If so, there are displayed in the error message area 55 on the monitor 43 at a step ST81 such messages "In successive "A" substrates, the part identified by No. "_" is faulty in package", "In successive "B" substrates, more than "C" substrates No. "_" are faulty in package", or "In one substrate, frequency of occurrence of faultily packaged parts Q exceeds "D %". Additionally, the alarm lamp 35 is lit at a step ST81 to inform the operator of the alarm condition being met.

Unless the alarm condition is met at the step ST80, the CPU 46 skips the steps ST81 and ST82.

At a step ST83, the CPU 46 supplies a faulty substrate signal to the sorter 17 for thereby allow the packaged substrate 26 just inspected to be fed to a faulty substrate line.

On the other hand, unless there exists no faulty parts 27d, the CPU 78 jumps from the step ST78 to a step ST84 where the CPU 46 supplies a satisfactory substrate signal to the sorter 17, whereupon the packaged substrate 26 just undergone the inspection is sorted onto a good substrate line.

Subsequently, the CPU 46 checks at a step ST85 whether inspection has been completed for all the packaged substrates 26 to be inspected. If the result is negative (NO), the step ST71 is regained, where the processing described hereinbefore is repeated for the remaining packaged substrates to be inspected. Thus, the inspecting operation comes to an end.

As will be appreciated, by virtue of such arrangement that an alarm is produced when the mount failure information obtained in the course of inspecting the packaged substrate satisfies the present alarm condition, such situation in which only specific parts suffer the package failure can be informed to the operation, whereby the cause for the package failure can be eliminated at earlier stage.

Further, since the state of the package failure is displayed in more concrete terms on the monitor, the cause for the package failure can be readily recognized.

According to a further embodiment of the invention, the CPU 46 can perform the following operation for determining whether the land pattern formed on the substrate is to be satisfactory or not.

Figure 29:
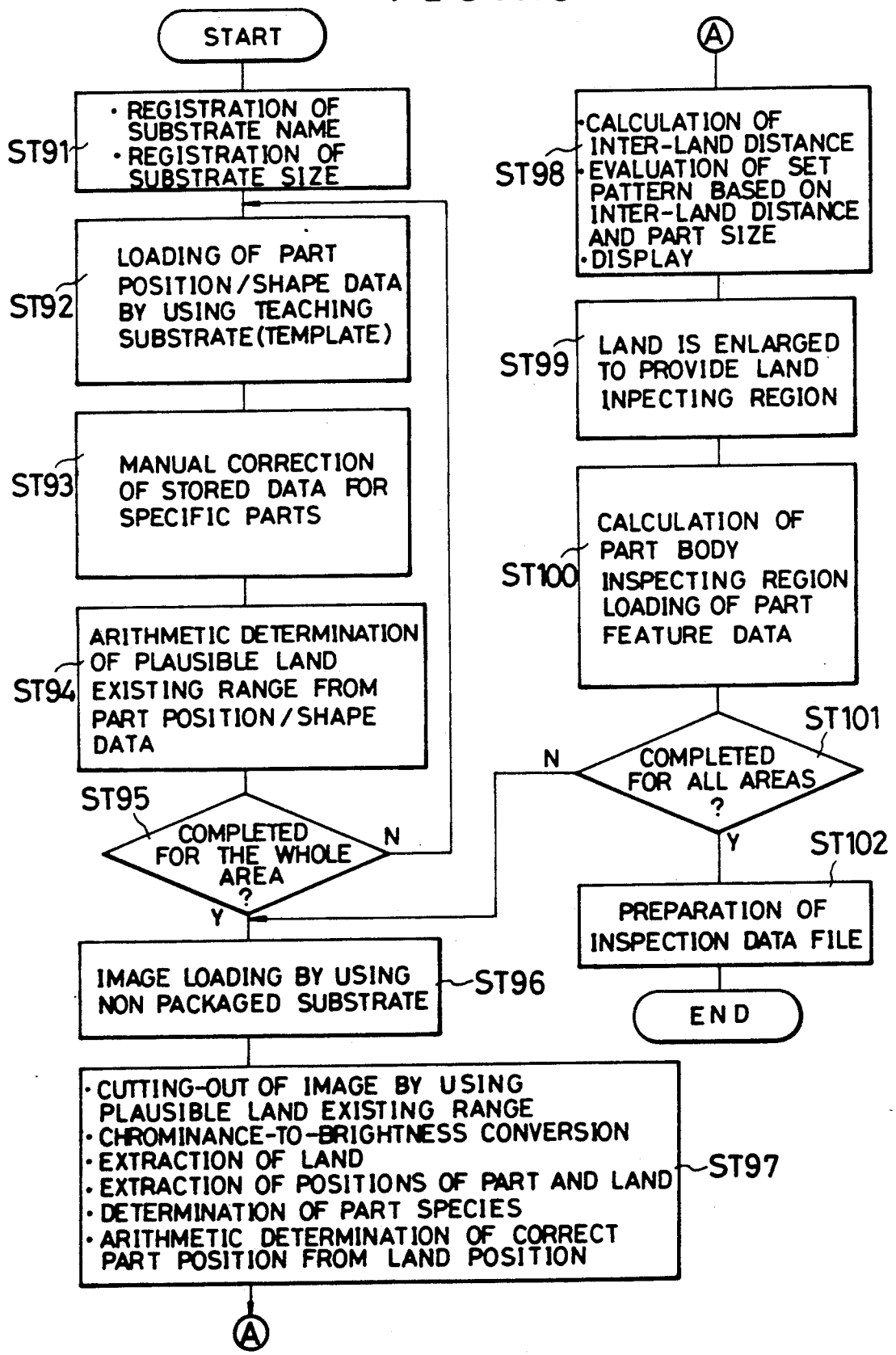
FIG. 29 is a view illustrating in a flow chart a teaching routine for deciding whether a land pattern is good or not in the packaged substrate inspecting apparatus according to the present invention.

When a new packaged substrate 26 is to be inspected, the CPU 46 commands the monitor or CRT display unit 43 to display a message requesting for the entry of data concerning the identification name (e.g. identification number) of the substrate and the size thereof, as illustrated in a teaching flow chart of FIG. 29 at a step ST91.

When the substrate identification name and size data as prompted are entered through the keyboard 45, the CPU 46 waits for disposition of a substrate designed for the teaching purpose on the X-Y table or stage 32 at a step ST92. In this connection, it should be mentioned that the teaching substrate is colored in white at regions where electric/electronic parts are to be mounted with the remaining area being painted in black. When the template substrate 24 has been disposed on the X-Y table assembly 20 through the X-Y stage controller 41 so that a first area of the template substrate 24 whose image is to be picked up is positioned below the color TV camera 34.

The image information produced by the color TV camera 34 undergoes A/D conversion through the A/D converter 36 under the control of the CPU 46. The results of the A/D conversion (i.e. the digitized image data of the substrate 24) is stored in the memory 37 on the real time basis.

Subsequently, the CPU 46 reads out successively the image data of R-pixels (or alternatively, G- or B-pixels) from the memory 37. The image data as read out are then converted into binary signals through the image processor 39, from which the data concerning the white regions on the substrate 24 (the part portion 27a) is extracted. Subsequently, positional data as well as shape (profile) data of the parts 27a obtained through the extracting operation are entered in the teaching table 38.

Figure 31:
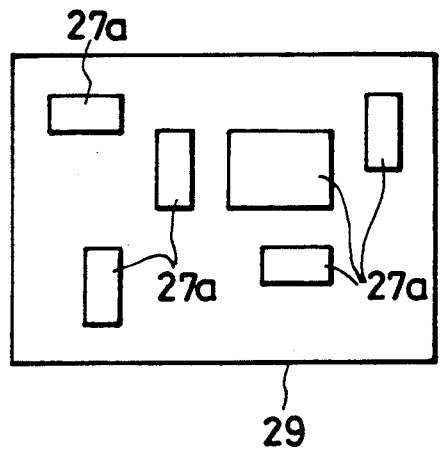
FIG. 31 is a schematic view showing, by way of example, locations and shapes of parts at the time when the decision is made as to the quality of land pattern.

At a step ST93, the CPU 46 creates a layout image 29 of the parts on the basis of the position data and the shape data of the parts 27a, the layout image being the displayed on the CRT display unit 43, as is shown in FIG. 31. For a specific part, the CPU 46 can produce a message prompting the operator to input manually the relevant data through the keyboard 45. When operator inputs the position/shape data of the specific part, the corresponding data for the same part stored in the teaching table 38 are modified correspondingly.

Figure 32:
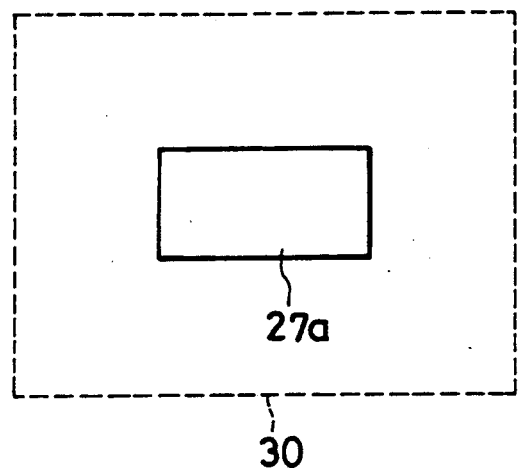
FIG. 32 is a view showing, by way of example, a plausible land existing range which is made use of in the land pattern quality decision procedure.

Subsequently, the CPU 46 reads out sequentially the position data and the shape or profile data of the parts 27a stored in the teaching table 38 at a step ST94, to thereby establish the plausible land covering or existing range 30 for each of the parts 27a, as is illustrated in FIG. 32.

In this connection, it should be mentioned that the plausible land covering range 30 is created for finding out the land to which the part 27a can be connected electrically and mechanically. To this end, the plausible land covering range 30 is given a sufficiently large area so that the land to which the part 27a is to be connected can be extracted regardless of whether the part 27a is a three-electrode element such as transistor or a two-electrode element such as resistor, capacitor or the like.

When the plausible land covering or existing ranges 30 have been established for all the parts, respectively, located within the first imaged area, the CPU 46 places data of the plausible land covering or existing ranges 30 in the teaching table 38. Subsequently, the species identification routine returns to the aforementioned step ST92 by way of a step ST95. When the plausible land existing ranges 30 have been created for all the remaining picked-up areas, the routine jumps from the step ST95 to a step ST96, where the CPU 46 waits for disposition of a non-packaged substrate 25 on the X-Y table assembly 20 after the template substrate 24 for the teaching purpose has been removed therefrom.

When the non-packaged substrate 25 is positioned on the X-Y table 20, the CPU 46 causes the X-Y table 20 to be moved so that a first area of the non-packaged substrate 25 whose image is to be picked is positioned beneath the color TV camera 34.

Subsequently, the image signal generated by the color TV camera 34 is subjected to A/D conversion under the control of the CPU 46, the result of which (i.e. image data of the non-packaged substrate 25) are stored in the memory 37 on the real time basis, being followed by the processing at a step ST97.

At the step ST97, the CPU 46 reads out sequentially the data of the plausible land existing range 30 from the teaching table 38 and supplies the data to the image processor unit 39 which is also supplied with the image data of the non-packaged substrate 25 read out from the memory 37. In the image processor unit 39, an image of the plausible land existing range is cut out from the image data mentioned above.

Subsequently, the CPU 46 issues a chrominance-to-brightness conversion command to the image processor unit 39 which responds thereto by performing the chrominance/brightness conversion on individual pixels constituting parts of the image within the plausible land existing range 30. For the chrominance/brightness conversion, the same conversion equations (1), (2), (3), and (4) as employed in the preceding embodiment are used.

Upon completion of the abovementioned chrominance-to-brightness conversion for all the pixels within the plausible land existing range 30, the CPU 46 checks whether the red chrominance signals Rc (i, j) of all the pixels (i, j) within the plausible land existing range 30 exceed a land extracting reference value C (e.g. C=0.4·α) which has been previously loaded, for thereby extracting the land 28b §§§located within the plausible land existing range 30.

Subsequently, the position data as well as shape or profile data of the land 28b is stored in the teaching table 38 under the command of the CPU 46, which then verifies the number and the positions of the land 28b which can be connected to the part 27a.

Figure 33A:
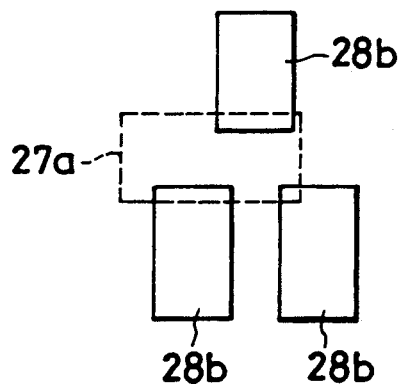
FIG. 33(A) is a schematic view showing an example of the part decided to be a transistor in the land quality decision procedure.
Figure 33B:
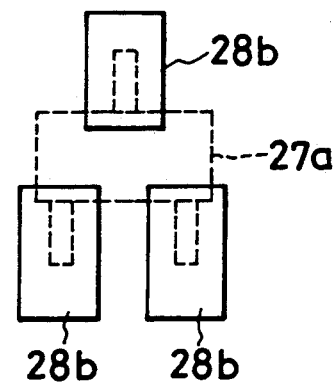
FIG. 33(B) is a schematic view for illustrating position correcting operation for the part decided to be the transistor.

In this conjunction, when there exist three lands 28b capable of being connected to the part 27a as shown in FIG. 33A and when these lands 28a are disposed at opposite sides of the part 27a with a ratio of 1:2, this part 27a is recognized as a transistor by the CPU 46. Thereafter, the CPU 46 determines the correct position of the part 27a for the associated lands 28b to correct the position of the part 27a as is illustrated in FIG. 33B. The corresponding position data of that part 27a stored in the teaching table 38 is also altered correctively on the basis of the result of the conversion mentioned above.

Figure 34A:
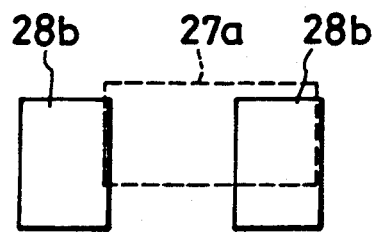
FIG. 34(A) is a schematic view showing an example of the part identified as a resistor or capacitor in the land pattern quality decision procedure.
Figure 34B:
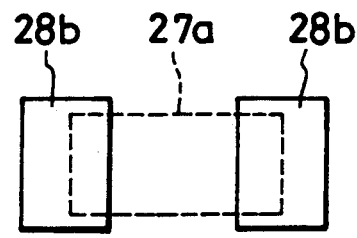
FIG. 34(B) is a schematic view for illustrating position correcting operation for the part identified as the resistor or capacitor.

On the other hand, when two lands 28b are present which can be connected to the part 27 and that the lands are provided on opposite ends of the part 27a with a ratio of 1:1, that part 27a is recognized to be a two-electrode part such as a resistor or capacitor. On the basis of the positions of the lands 28b for the part 27a, the correct position thereof is determined to correct the actual position of the part 27a, as is illustrated in FIG. 34B. The position data of the same part 27a stored in the teaching table 38 is also corrected in accordance with the result of the correction mentioned above.

Figure 35:
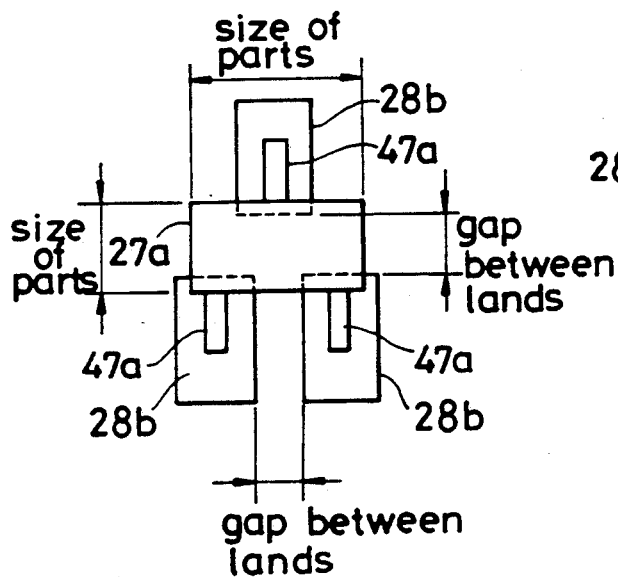
FIG. 35 is a schematic view for illustrating a land pattern evaluating operation for the part identified as a transistor.
Figure 36:
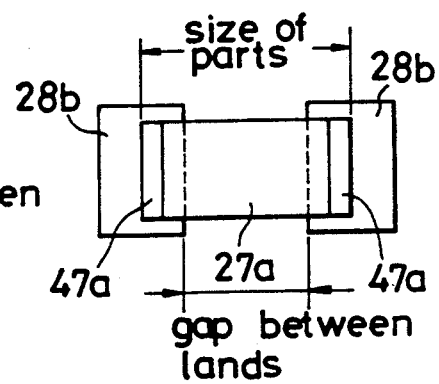
FIG. 36 is a schematic view for illustrating a land pattern evaluating operation for the part identified as a resistor or capacitor.
Figure 37:
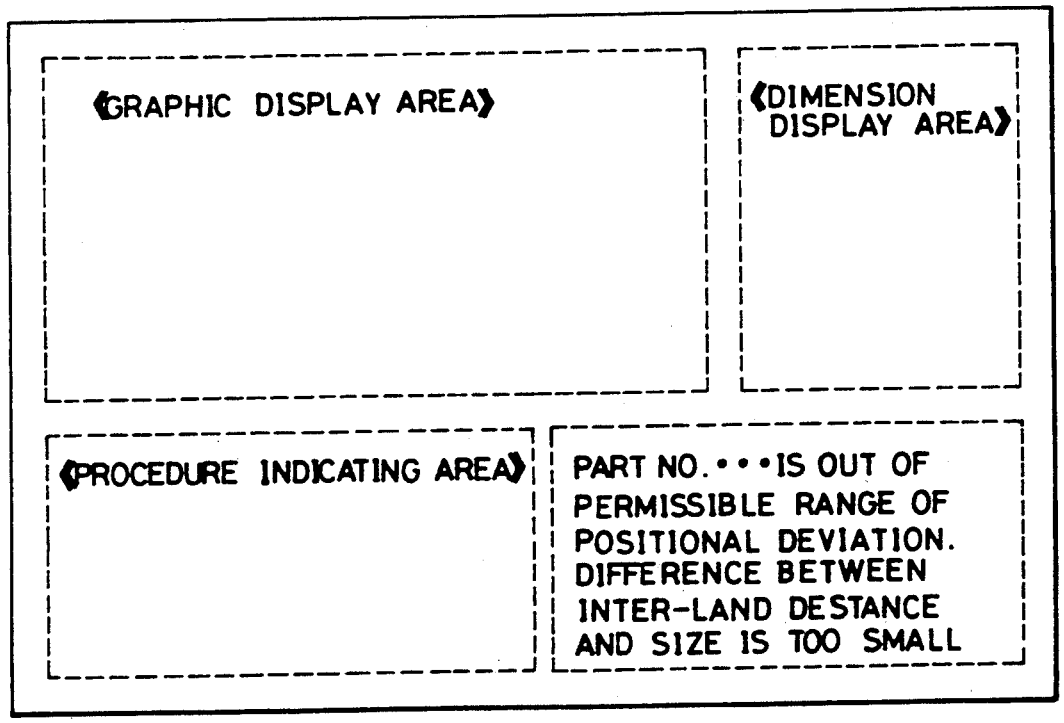
FIG. 37 is a schematic view showing, by way of an example, a display of the results of the land pattern evaluation processing.

Subsequently, at a step ST98, the CPU 46 arithmetically determines the inter-land distance among the lands with reference to the parts 27a, respectively, as illustrated in FIGS. 35 or 36. The results (i.e. inter-land distance data) are checked as to whether it is proper to the part size.

It should be mentioned that the inter-land distance data are utilized for indicating the permissible tolerances of the parts to a mounter mechanism and/or for evaluating the land pattern design.

When the relation between the inter-land distance and the part size is improper, there can be displayed on the CRT monitor 43 in the error message area such a message reading "Difference is too small between inter-land distance and size of a part No. "_", falling out of permissible range", informing the operator of the fact that the part 27a is not matched with the lands 28b to which the part 27a is to be connected.

Figures 38A, 38B:
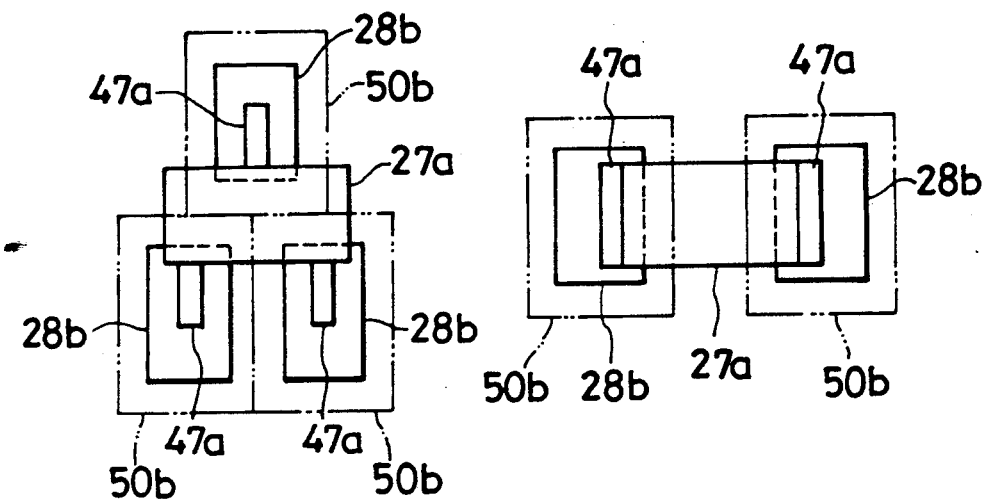
FIGS. 38(A) and 38(B) are schematic view showing examples of land inspecting regions, respectively, which are made use of in the land pattern quality decision procedure.

Next, at a step ST99, the CPU 46 expands or enlarges the shape (profile) of the land 28b, as is illustrated in FIGS. 38A and 38B, to arithmetically determine the land inspecting region 50b, the resulting data of the land inspecting region being stored in the teaching table 38.

Figures 39A, 39B:
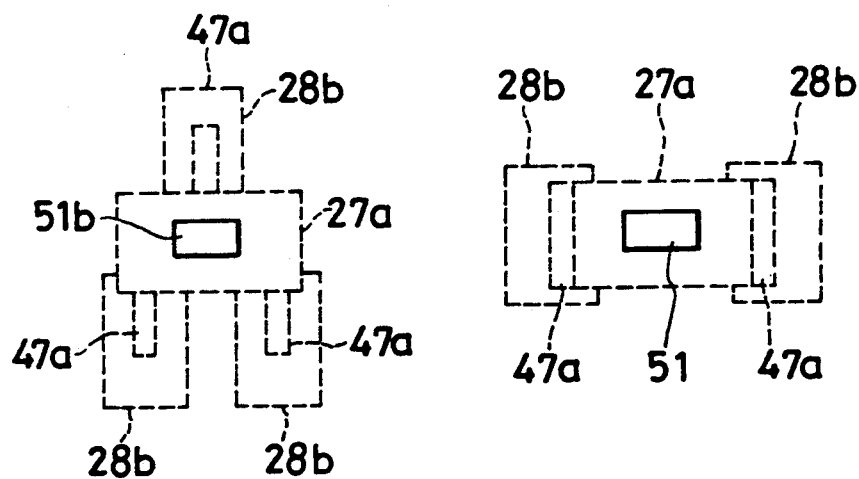
FIGS. 39(A) and 39(B) are schematic views showing examples of part body inspecting regions for the individual parts, respectively, which are made use of in the land pattern quality decision procedure.

Thereafter, at a step ST100, the CPU 46 arithmetically determines a part body inspecting region 51b for the purpose of cutting out the image of a center portion of each part 27a on the basis of the data concerning the position and shape (profile) of the land 28b, as illustrated in FIGS. 39A and 39B, the results also being stored in the teaching table 38. At this stage, a message requesting for the feature data (e.g. color data) of the body of each part 27a is displayed on the CRT display unit. In response, operator enters all the feature data for all the parts 27a manually through the keyboard 45, which are then stored in the teaching table 38 under the control of the CPU 46.

Upon completed execution of the routine including the land extraction processing to the feature data loading processing for all the parts 27a located within the first picked-up area, the CPU 46 returns to the step ST96 by way of a step ST101, whereupon the processing described above is repeatedly executed for all the remaining areas picked-up by the imaging device 34.

When the aforementioned processing comes to an end after having been performed for all the parts in all the picked-up images, the program executed by the CPU 46 jumps to a step ST102 from the step ST101.

At the step ST102, the CPU 46 rearranges the data stored in the teaching table 38 to prepare an inspection data file which is again stored in the teaching table 38, whereupon the teaching operation comes to an end.

Figure 30:
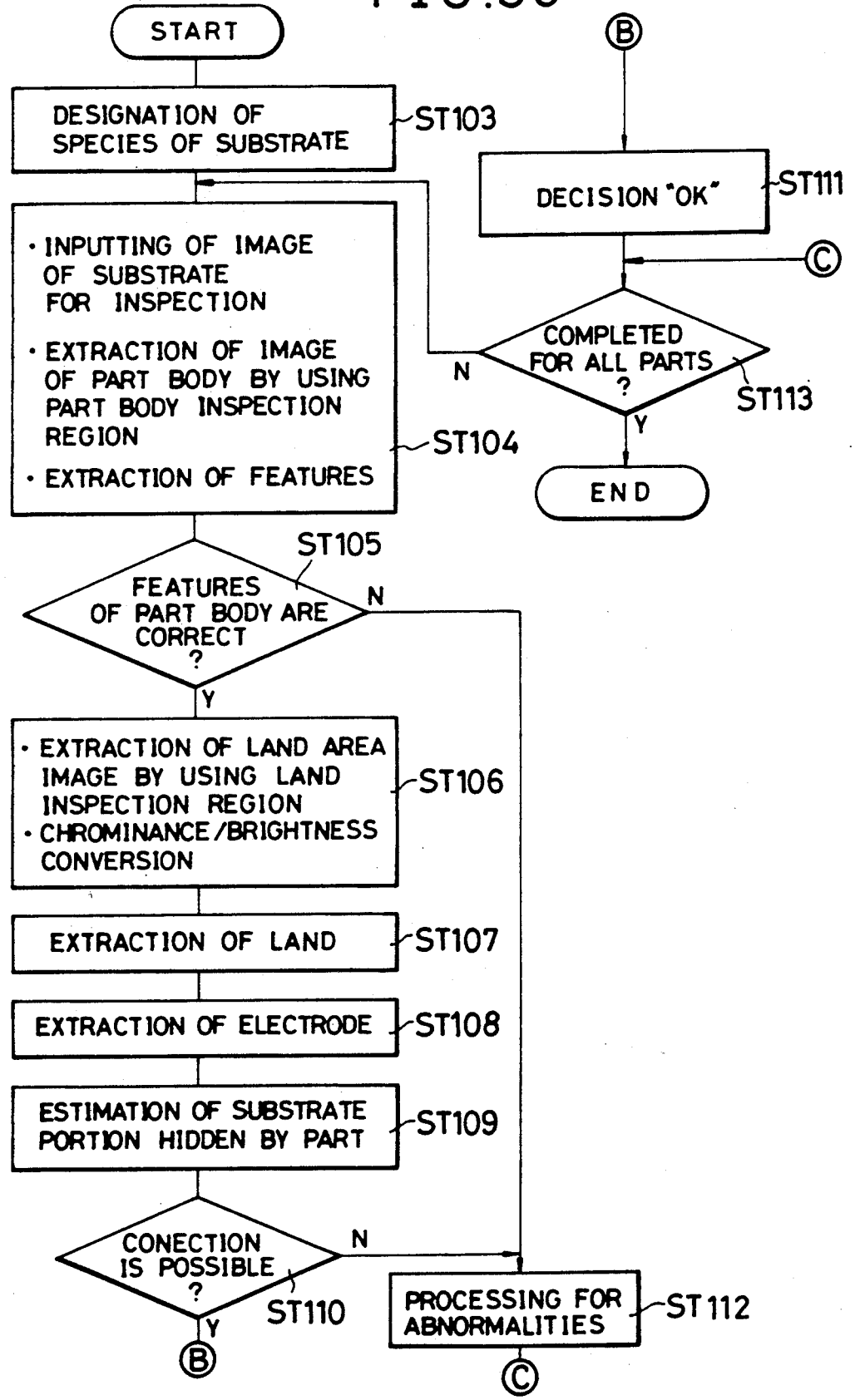
FIG. 30 is a view illustrating in a flow chart an inspecting procedure for deciding whether the land pattern is good or not.

When an inspection or idintification mode is activated at the end of the teaching operation, the CPU 14 generates a message on the screen of the CRT display unit 43, the message requesting the entry of identification name of a packaged substrate 26 to be inspected at a step ST103 in the inspection flow chart illustrated in FIG. 30.

After the identification name of the substrate has been entered by operator through the keyboard 45, the CPU 46 waits for disposition of a corresponding packaged substrate 26 to be inspected on the X-Y table 32 at a step ST104. When the substrate 26 to be inspected is disposed, the CPU 46 causes the X-Y table assembly 20 to be moved through the X-Y stage controller 41 to the position where the first area to be imaged of the packaged substrate 26 for inspection is located below the color TV camera 34.

The image signal produced by the color TV camera 34 is converted into a digital signal through the A/D converter 36 under the control of the CPU 46, the result of the A/D conversion (i.e. image data of the packaged substrate 26 under test) are stored in the memory 37 on the real time basis.

Subsequently, the CPU 46 reads out the data of a part body inspection region 51b from the teaching table 38 and supplies them to the image processor unit 39 which is also supplied with the image data of the packaged substrate 26 under inspection from the memory 37. In the image processor unit 39, the image of the part body region 51b to be inspected is cut out from the image data.

Next, the CPU 46 issues a feature extracting command to the image processor unit 39 which responds thereto by extracting the feature data of the image of the cut-out part body inspection region 51b (which can be accomplished, for example, through chrominance rightness conversion of pixels of the image).

Thereafter, the CPU 46 makes decision at a step ST105 as to whether the feature data of the image located within the aforementioned part body inspection region 51b coincides with the feature data of the parts 27a stored in the teaching table 38. If coincidence is found, the inspection routine makes a jump from the step ST105 to a step ST106 where the land inspection region 50b is read out from the teaching table 38 and transferred to the image processor unit 39 which is also supplied with the image data of the packaged substrate 26 under inspection from the memory 37, whereupon the image of the land inspection region 50b is cut out from that image data.

At this stage, the CPU 46 issues a command for chrominance/brightness conversion to the image processor unit 39, whereby the individual pixels (picture elements) constituting the aforementioned land inspection region 50b undergo the chrominance-to-brightness conversion.

Upon completion of the chrominance/brightness conversion mentioned above for all the pixels within the land inspection region 50b, the CPU 46 checks whether the red chrominance signal Rc (i, j) for each pixel within the land inspection region 50b exceeds a preset land extraction reference value C (e.g. C may be selected equal to 0.4·α), to thereby extract the land 28c located within the land inspection region 50b at a step ST107.

Subsequently, at a step ST108, the CPU 46 checks whether the brightness BRT (i, j) of each pixel within the land inspection region 50b exceeds a preset reference value D for extraction of electrodes, to thereby extracts the electrode images 47c from the land inspection region 50b.

At a step ST109, the CPU 46 makes comparison of the land 28c with that of the land 28b of the non-packaged substrate 25 stored in the teaching table 38 with respect to the shape (profile) by referring to the position and shape of the electrode 47c located within the land inspection region, to thereby arithmetically determine (estimate) the portion of the land 28 which is hidden by the part 27c.

At a step ST110, the CPU 46 utilizes the results of the arithmetic determination to determine the coverage area data (the data of area of the land 28c covered by the part 27c), the width data and which indicate the positional relationship between the land 28c and the part 27c, as is shown in FIGS. 21A and 21B. Additionally, it is checked if the values of these data are appropriate.

When the determined data values are found proper, the inspection routine branches from the step ST110 to a step 111 where it is determined that the part 27c is mounted in a satisfactory manner, which fact may be indicated on the CRT display unit 43 and/or printed out by the printer 44.

On the other hand, when it is found at the steps ST105 and ST110 that the feature data of the image located within the part body inspection region 51b do not coincide with the feature data of the parts 27a stored in the teaching table 38, decision is made that the coverage area data, width data and the length data which are indicative of the positional relationship between the land 28c and the part 27c are not proper. In that case, the inspection routine executed by the CPU 46 branches from the steps ST105, ST110 to a step ST112 where the mounting failure, i.e. unsatisfactory mounted state of the part 27c, is decided and displayed on the CRT screen 43 and/or printed out by the printer 44 (abnormality processing).

Thereafter, the CPU 46 regains the step ST104 by way of a step ST113, whereby the processing described above is executed repeatedly for all the remaining image picked-up areas.

The abovementioned processing is executed repeatedly for the remaining parts located within the first imaged area. Upon completion of the inspection processing for all the parts 27c in all the remaining areas, the inspection processing comes to an end.

As will be seen from the foregoing description, since the image of the lands 28b of the non-packaged substrate 27a are extracted and displayed to show whether the lands 28b are matched with the part 27a, any erroneous design of the lands 28b can be instantaneously detected.

Further, the satisfactory mounted state can be decided so far as the part 27c is mounted on the land 28c within the permissible range even when the land 28c differs from one to another substrate, whereby the erroneous decision attributable to the manufacturing tolerance can be positively prevented. In other words, the permissible positional deviation can thus be automatically established optimally for each of the parts 27c.

The mounted states of the parts illustrated in FIGS. 22A, 23A and 23B are decided to be satisfactory, while the mounted states illustrated in FIGS. 22B, 22C, 23C and 23D are decided to be unsatisfactory.

Although description has been made such that the entry of the feature data of the part 27a is executed through manual operation of the keyboard 45, it will be readily understood that the entry of the feature data of the part 27a assumed to be effected manually can also be realized automatically by making use of the standard packaged substrate.

In the foregoing, description has been made on the assumption that the position and shape of the part 27a inputted by using the template substrate 24 for the teaching purpose are compared with those of the lands 28b inputted by using the non-packaged substrate 25 for evaluation of the land pattern. It should however be noted that such evaluation can be equally accomplished by using the reference packaged substrate.

Although the invention has been described in conjunction with the preferred embodiments thereof, it will be appreciated that numerous modifications and changes will readily occur to those skilled in the art without departing from the spirit and scope of the invention.

We claim:

1. A method for determining whether parts having at least two electrodes are correctly mounted relative to conductor lands on a packaged printed circuit board, comprising:

picking up an image of the packaged circuit board and producing image data corresponding to the packaged circuit board;

extracting conductor land shape data corresponding to the position of the conductor lands from the image data;

deciding from the image data the state of the parts relative to the conductor lands located on the packaged circuit board;

displaying a result of said decision means and the position of the parts and conductor lands relative to each other.

2. The method as claimed in claim 1, further comprising subjecting said conductor land shape data to chrominance/brightness conversion.

3. The method as claimed in claim 2, wherein said decision step includes checking whether said conductor land shape data which has been subjected to chrominance/brightness conversion exceeds a predetermined reference value for each pixel within a conductor land extracting region.

4. The method as claimed in claim 1, wherein different kinds of said parts are mounted on the circuit board and said decision step uses a plurality of inspecting algorithms, and wherein each of the inspecting algorithms cuts out an image portion from the image data which is appropriate for one kind of the parts, and decides from the image portion the state of the one kind of the parts on the packaged circuit board.

5. The method as claimed in claim 1, further comprising setting an alarm condition, and generating an alarm when the alarm condition is satisfied.

6. The method as claimed in claim 5, wherein said alarm condition is satisfied when misalignment of a same part is detected on a predetermined number of successive packaged circuit boards set in said setting step.

7. The method as claimed in claim 5, wherein said alarm condition is satisfied when, for a plurality of successive packaged circuit boards, misalignment of a same part is detected on a number of said successive packaged circuit boards which exceeds a predetermined number set in said setting step.

8. The inspection apparatus as claimed in claim 5, wherein said alarm condition is satisfied when a ratio of detection of misaligned parts to detection of aligned parts on a single packaged circuit board exceeds a predetermined ratio.

9. The inspection apparatus as claimed in claim 1, wherein said decision step further includes processing said image data to determine whether the position of the land on the packaged circuit board is satisfactory.

10. A packaged substrate inspecting apparatus for determining whether parts having at least two electrodes are correctly mounted relative to conductor lands on packaged printed circuit boards, comprising:

image taking means for producing images of a bare printed circuit board and a circuit board having components mounted thereon;

land extracting means for extracting from the images produced by the image taking means the conductor lands on which components are to be mounted and for obtaining land shape data corresponding to geometrical characteristics of the conductor lands;

positional relationship determining means for determining positional relationships between the conductor lands on the printed circuit board and components mounted thereon on the basis of the geometrical data obtained by the land extracting means;

decision means for deciding from the positional relationships obtained by the position relationship determining means if a component is properly placed and producing a result indicative thereof; and visualizing means for displaying the result of the decision and the position of the components and the lands relative to each other.

11. The inspecting apparatus as claimed in claim 10, further comprising means for subjecting said land shape data to chrominance/brightness conversion.

12. The inspecting apparatus as claimed in claim 11, wherein said decision means checks whether said land shape data which has been subjected to chrominance/brightness conversion exceeds a predetermined reference value for each pixel within a land extracting region.

13. The inspection apparatus as claimed in claim 10, wherein different kinds of said parts are mounted on the circuit board and said decision means has a plurality of inspecting algorithms, and wherein each of the inspecting algorithms cuts out an image portion from the image data which is appropriate for one kind of the parts, and decides from the image portion the state of the one kind of the parts on the packaged circuit board.

14. The inspection apparatus as claimed in claim 10, further comprising alarm condition setting means for setting an alarm condition, and an alarm generating means for generating an alarm when the alarm condition is satisfied.

15. The inspection apparatus as claimed in claim 14, wherein said alarm condition is satisfied when misalignment of a same part is detected on a predetermined number of successive packaged circuit boards set by said alarm condition setting means.

16. The inspection apparatus as claimed in claim 14, wherein said alarm condition is satisfied when, for a plurality of successive packaged circuit boards, misalignment of a same part is detected on a number of said successive packaged circuit boards which exceeds a predetermined number set by said alarm condition setting means.

17. The inspection apparatus as claimed in claim 14, wherein said alarm condition is satisfied when a ratio of detection of misaligned parts to detection of aligned parts on a single packaged circuit board exceeds a predetermined ratio.

18. The inspection apparatus as claimed in claim 10, wherein said decision means processes said image data and determines whether the position of the land on the packaged circuit board is satisfactory.

* * * * *